(12) United States Patent
Vigoda et al.

(10) Patent No.: US 8,572,144 B2
(45) Date of Patent: Oct. 29, 2013

(54) SIGNAL MAPPING

(75) Inventors: Benjamin Vigoda, Winchester, MA (US); Jeffrey Bernstein, Middleton, MA (US); Alexander Alexeyev, Beverly, MA (US)

(73) Assignee: Analog Devices, Inc., Norwood, MA (US)

( * ) Notice: Subject to any disclaimer, the term of this patent is extended or adjusted under 35 U.S.C. 154(b) by 629 days.

(21) Appl. No.: 12/716,113

(22) Filed: Mar. 2, 2010

(65) Prior Publication Data

US 2010/0281089 A1 Nov. 4, 2010

Related U.S. Application Data

(60) Provisional application No. 61/156,721, filed on Mar. 2, 2009, provisional application No. 61/293,439, filed on Jan. 8, 2010.

(51) Int. Cl.
*G06F 1/02* (2006.01)
*G06F 7/58* (2006.01)

(52) U.S. Cl.
USPC .......................... 708/274; 708/200; 708/270

(58) Field of Classification Search
None
See application file for complete search history.

(56) References Cited

U.S. PATENT DOCUMENTS

| 5,243,688 | A | 9/1993 | Pechanek et al. |
| 5,745,382 | A | 4/1998 | Vilim et al. |
| 6,510,229 | B1 | 1/2003 | Geile |
| 6,714,462 | B2 | 3/2004 | Pan |
| 6,763,340 | B1 | 7/2004 | Burns et al. |
| 7,451,174 | B2 | 11/2008 | Loeliger |
| 7,616,481 | B2 | 11/2009 | Mokhlesi |
| 2001/0023419 | A1* | 9/2001 | Lapointe et al. .......... 706/15 |
| 2009/0144411 | A1* | 6/2009 | Winkler et al. .......... 709/224 |

FOREIGN PATENT DOCUMENTS

| EP | 0614157 | 10/1999 |
| WO | WO00/41507 | 7/2000 |
| WO | WO2010/101937 | 9/2010 |

OTHER PUBLICATIONS

Rivet, A 65nm CMOS RF Front End Dedicated to Software Radio in Mobile Terminals, Proc. SDR 2008.
International Search Report for PCT/US2010/25945, Apr. 20, 2010.

* cited by examiner

*Primary Examiner* — Scott Sun
(74) *Attorney, Agent, or Firm* — Occhiuti Rohlicek & Tsao LLP

(57) ABSTRACT

A circuit includes a signal processing circuit for accepting an input and for generating a set of outputs. The input is provided in an input range that has a set of representative values, and each output represents a measure of an association of the input with one or more of the representative values. The signal processing circuit includes a group of output sections, each output section being responsive to the input of the signal processing circuit. Each output section includes one or more sigmoid generators. Each sigmoid generator is responsive to an input of the output section to generate an output that represents a sigmoid function of the input of the output section. Each output section also includes a circuitry for combining the outputs of the one or more sigmoid generators to form one of the set of outputs of the signal processing circuit. An input transformation circuit is coupled to the plurality of output sections. The input transformation circuit is configurable to transform the input of the signal processing circuit for controlling a mapping characteristic from the input to the set of outputs.

30 Claims, 34 Drawing Sheets

SIGNAL MAPPING

CROSS-REFERENCE TO RELATED APPLICATIONS

This application claims the benefit of U.S. Provisional Application Ser. No. 61/156,721, titled "Signal Mapping," filed Mar. 2, 2009 and U.S. Provisional Application Ser. No. 61/293,439, titled "Signal Mapping" and filed Jan. 8, 2010, the contents of both of which are incorporated herein by reference.

This application is also related to U.S. Provisional Application Ser. No. 61/156,721, titled "Belief Propagation Processor," filed Mar. 2, 2009, U.S. Provisional Application Ser. No. 61/156,794, titled "Circuits for Soft Logical Functions," filed Mar. 2, 2009, and U.S. Provisional Application Ser. No. 61/156,735, titled "Circuits for Soft Logical Functions," filed Mar. 2, 2009. The contents of the above applications are incorporated herein by reference.

STATEMENT AS TO FEDERALLY SPONSORED RESEARCH

This invention was made with government support under FA8750-07-C-0231 awarded by the Defense Advanced Research Projects Agency (DARPA). The government may have certain rights in this invention.

BACKGROUND

This specification relates to signal mapping, for instance to a receiver circuit for communication systems.

Communication systems can be used for information exchange between users. Such systems allow for data transmission over a wide range of distances and via different types of media (e.g., air and wire). Various coding techniques may be used to improve communication performance. Similar coding techniques may be used for storage systems.

FIG. 1 shows an example of a communication system 100 that includes a transmitter 110, a communication channel 120, and a receiver 130. The transmitter 110 receives an input (e.g., a digital bit string) and modulates it into a suitable form (e.g., an analog signal such as electromagnetic waves) for transmission over the communication channel 120 (e.g., air). The receiver 130 receives the transmitted signal and demodulates it back into the digital form for output.

In some applications, signals are coded prior to transmission for various purposes. One such application relates to error reduction and/or correction for signals delivered in the presence of channel noise. In these cases, an encoder 112 may be used to introduce carefully designed redundancy into the input signal to generate coded bit strings (sometimes also referred to as codewords). A mapper 114 establishes a direct mapping between the coded bit strings and a set of symbols, where each symbol corresponds to a respective value of a physical attribute(s) of the analog signal to be transmitted over the channel. At the receiver side, once the transmitted signal is received, a demapper 134 extracts bit estimates from the observed values, and a decoder 136 (or in some other examples, a soft iterative equalizer such as Viterbi equalizer) subsequently decodes the bit estimates to recover the digital signal.

As the received signals can be affected by channel noise, in some examples, it may be useful to first interpret the noisy signal as "soft" bits and then decode these soft bits into digital data. A soft bit provides a measure of reliability of bit estimates—in the case of binary coding, the probability of a received bit having a value of zero or one.

SUMMARY

Some general aspects of the invention relate to a circuit, for example, configured for extracting information from noisy input. The circuit includes a signal processing circuit for accepting an input and for generating a set of outputs. The input is provided in an input range that has a set of representative values, and each output represents a measure of an association of the input with one or more of the representative values.

The signal processing circuit includes a group of output sections, each output section being responsive to the input of the signal processing circuit. Each output section includes one or more sigmoid generators. Each sigmoid generator is responsive to an input of the output section to generate an output that represents a sigmoid function of the input of the output section. Each output section also includes a circuitry for combining the outputs of the one or more sigmoid generators to form one of the set of outputs of the signal processing circuit.

An input transformation circuit is coupled to the plurality of output sections. The input transformation circuit is configurable to transform the input of the signal processing circuit for controlling a mapping characteristic from the input to the set of outputs.

Embodiments may include one or more of the following features.

The output of the sigmoid generator may represent a second sigmoid function of the input to the signal processing circuit.

The mapping characteristic from the input to the set of outputs may be associated with a characteristic of the second sigmoid function.

The characteristic of the second sigmoid function may include a location of a transition point of the sigmoid function, and/or a rate of change at the transition point of the sigmoid function.

In some examples, at least one output section includes two sigmoid generators.

Each output section further includes an output transformation circuit configurable to transform the output of the corresponding one or more sigmoid generators for controlling a second mapping characteristic from the input to the set of outputs.

Each sigmoid generator may be configured using a differential pair circuit. The differential pair circuit may include a pair of transistors each configured to receive the input of the sigmoid generator in a respective one of two polarities.

The differential pair circuit may include a pair of MOSFET transistors configured to operate in an above-threshold operation regime. Alternatively, the differential pair circuit may include a pair of bipolar junction transistors.

The input to the signal processing circuit may include an analog signal representing a digital string transmitted in the form of a symbol over a communication channel. The analog signal may include a noise component at least partially determined by the communication channel. For example, the analog signal may include a Gaussian noise component.

Each representative value of the input range may be associated with a respective one of a discrete set of possible symbols.

In some examples, each output of the signal processing circuit represents a respective probability that the transmitted symbol corresponds to one of the possible symbols. In some other examples, each output of the signal processing circuit represents a respective probability of a corresponding digit of the transmitted digital string having one of a discrete set of possible values. The transmitted digital string may be a binary string. In some other examples, the output of the signal processing circuit represents the respective probability of a corresponding digit of a binary number representing a pixel intensity level in the image before noise was added. In some other examples, any variable of interest could be used as the pixel intensity was used in the last example.

In some examples, each output of the signal processing circuit may include a representation of the transmitted bit or symbol in the log domain. In some examples, each output of the signal processing circuit may include a representation in the log domain of the bits or symbols that represent the states of the variable of interest.

The input to the signal processing circuit may be implemented in the form of a differential signal. Each input to the output sections may also be implemented in the form of a differential signal.

In another general aspect, a signal processing circuit is provided for accepting an input and for generating a set of outputs. The input is in an input range including a set of representative values. Each output represents a measure of an association of the input with one or more of the representative values.

The signal processing circuit includes a plurality of sections, each section generating a corresponding one of the set of outputs. Each section includes one or more input transformation circuits configurable to transform the input of the signal processing circuit for controlling a mapping characteristic from the input to the corresponding output. Each section also includes one or more sigmoid generators, each sigmoid generator coupled to a corresponding input transformation circuit and configured to receive the transformed input from the corresponding input transformation circuit and to generate a sigmoid output that represents a sigmoid function of the input. Each section further includes circuitry for combining the sigmoid outputs from the sigmoid generators to form one of the set of outputs of the signal processing circuit.

Embodiments may include one or more of the following features.

Each output in the set of outputs includes a representation of the input in the log domain, such as a log-likelihood ratio of the input.

Each section further includes one or more output transformation circuits. Each output transformation circuit is coupled to a corresponding sigmoid generator and is configurable to transform the corresponding sigmoid output for controlling a second mapping characteristic from the input to the corresponding output.

In a further general aspect, a method is provided for accepting an input and generating a set of outputs. The input is in an input range including a set of representative values. The each output represents a measure of association of the input with one or more of the representative values. The method includes transforming the input using input transformation circuitry to control a mapping characteristic from the input to the set of outputs.

The method also includes, in each of a plurality of output sections, generating at least one sigmoid output representing a sigmoid function of the transformed input, each sigmoid output generated by a corresponding sigmoid generator. The method also includes, in each of the plurality of output sections, combining the sigmoid outputs using combining circuitry to form one of the set of outputs.

Embodiments may include one or more of the following features. The output of the sigmoid generator represents a second sigmoid function of the input. The mapping characteristic from the input to the set of outputs is associated with a characteristic of the second sigmoid function, such as at least one of a location of a transition point of the sigmoid function and a rate of change at a transition point of the sigmoid function.

The method also includes, in each of the plurality of output sections, transforming each sigmoid output using corresponding output transformation circuitry to control a second mapping characteristic from the input to the set of outputs.

Embodiments may include one or more of the following advantages.

In some embodiments, systems and methods are provided for demodulating transmitted signals into soft bits by use of analog design. Such analog design does not require digitizing input and can generate, based on the input value observed by the receiver, "soft" bits (e.g., bit probabilities, or bit estimates together with reliability measures of those bit estimates). These soft bits, once produced in analog form, can be provided to a subsequent decoder (e.g., an error corrector) to decode transmitted digital bits.

In some embodiments, the analog design employs two-stage processing for generating soft bits: symbol detection and bit probability computation. Symbol detection can be implemented by suitable approximation of analytical quantities derived for symbol likelihoods using analog circuits, for example, sigmoid generators formed based on differential pair circuits. The analog circuits may adopt various types of transistors such as bipolar junction transistors (BJTs), metal-oxide-semiconductor field effect transistors (MOSFETs) that operate in weak-inversion regime (i.e., sub-threshold mode), and MOSFETs that operate in strong-inversion regime (i.e., above-threshold mode). Such analog circuits are operable using a variety of types of transistors in the circuit, and do not necessarily require transistors that exhibit an exponential current-voltage relationship. In some examples when above-threshold MOSFETs are used, circuit speed may be greatly improved.

In some embodiments, the systems and methods may be used for demodulating transmitted signals into symbol likelihoods, without necessarily producing soft bits.

In some examples, each symbol likelihood may be computed via a completely separate set of hardware elements rather than a section of one hardware element. Such modular implementation allows the analog design to be configurable for various applications, such as applications that require different number of quantization levels to be detected with uniform or non-uniform spacing of the quantization levels.

In many applications, it is useful to interpret the noisy signal as "soft" symbols and then equalize or decode or otherwise process these soft symbols into data. Beyond a communications system, one could also demap, for example, noisy image data. A pixel in an image could be considered to be an 8-bit fixed point variable, capable of taking on one of, say, 256 different intensity levels. In some cases, one may have knowledge about the Gaussian (or other kind of) noise that was added to the image due to, say, thermal noise in the CMOS image sensor that is used to capture the image. Knowing the variance or other properties of this noise distribution, a demapper could convert the raw signal from the image sensor into a probability for each of the 256 possible intensity levels.

Other features and advantages of the invention are apparent from the following description, and from the claims.

DETAILED DESCRIPTION

1 System Overview

The following description provides examples of a signal processing circuit that can be used, for example, in receivers for communication systems.

Communication systems can make use of signal modulation to convert information in the abstract sense (e.g., represented as bit strings) to the physical attributes of a transmitted signal. A direct relationship may be established between bit strings and symbols, with each symbol corresponding to a representative value of the physical attribute of the transmitted signal. For example, when data is transmitted over the air as electromagnetic waves, each symbol may represent a string of one or more bits and correspond to a level of a physical parameter (e.g., amplitude, phase, and frequency) of the waves.

Various signal modulation techniques can be used in communication systems. Examples include pulse amplitude modulation (PAM) and quadrature amplitude modulation (QAM). For purposes of illustration and without limitation, the following examples are described primarily in the context of PAM modulation using a Gray coding based mapping of strings to the set of encoded representations of the symbols (the symbol constellation). Other modulation techniques include binary phase shift keying (BPSK) and frequency shift keying (FSK).

Figure 1:
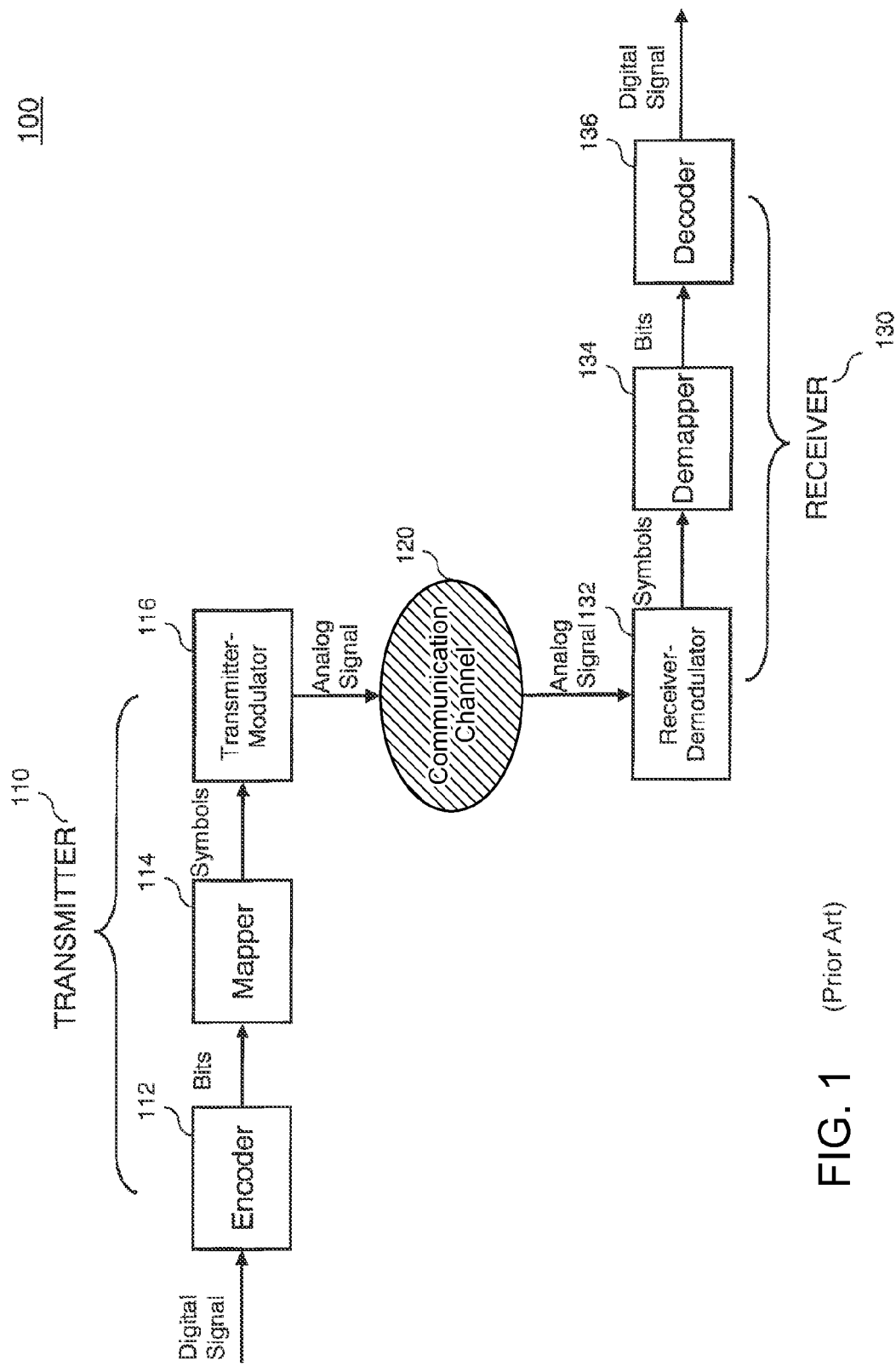
FIG. 1 is a block diagram of a communication system.
Figure 2:
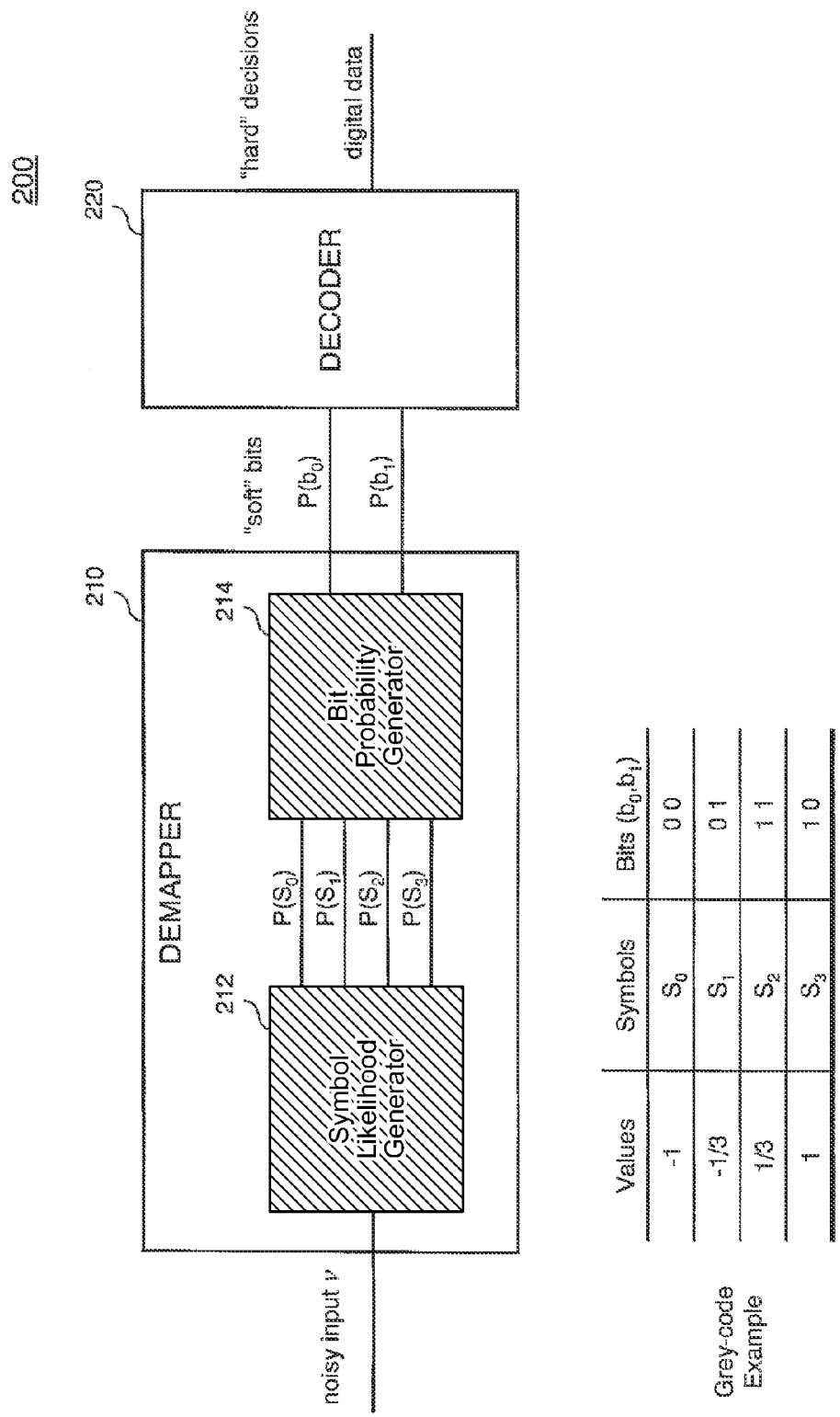
FIG. 2 is a block diagram of an exemplary analog implementation of a receiver for the communication system of FIG. 1.

FIG. 2 shows one embodiment of a receiver circuit 200 configured for use with the communication system of FIG. 1. The receiver circuit 200 includes a demapper 210 that converts a noisy input signal representing a value v, for example, a voltage encoded signal received from a receiver antenna representing a transmitted bit string, into "soft" bits. In some examples, a decoder 220 then uses the soft bits to make "hard" decisions, for example, to generate digital bits representing the transmitted bit string.

In some examples, to obtain the soft bits, the demapper 210 implements two-stage analog processing. More specifically, a symbol likelihood generator 212 generates a set of symbol likelihoods $P(S_k)$ from the input v corresponding to a string of bits at the transmitter, with each $P(S_k)$ representing the probability of the input being a given symbol $S_k$. Subsequently, a bit probability generator 214 generates the soft bits $P(b_i)$ using the generated symbol likelihoods, with each $P(b_i)$ representing the probability of the $i^{th}$ digit of the transmitted bit string being a zero or one (assuming binary codes are used in this example).

FIG. 2 also shows one example of a PAM4 (i.e., four-level amplitude modulated) constellation that forms a mapping between bit strings and symbols. Here, each two-digit string $(b_0,b_1)$ corresponds to one of four symbols $S_0$ to $S_3$, for example, string (0,0) corresponding to symbol $S_0$. Each symbol is designed to be associated with a representative value of the input, for example, $S_0$ with the value of −1.

Ideally, without the presence of any source of noise or distortion during data transmission, when an input of v=−⅓ is observed, the transmitted symbol is known to be $S_1$ and therefore corresponds to the transmitted bit string of (0,1). In practical applications, however, the value of the input v is often influenced by channel noise and/or other sources of signal distortion. Thus, the determination of the transmitted symbol given an observed input value v is probabilistic in nature.

More specifically, given a model M of the transmitter and the communication channel, and given a received value v, demapper 210 determines the probability of the input corresponding to a given bit vector b:

$$p(b|v,M)=p(b_0,b_1|v,M)$$

Using Bayes rule, the above equation can be factorized as $$p(b_0,b_1,v|M)=p(b_0|M)p(b_1|M)p(v|b_0,b_1,M).$$

The factors $p(b_0|M)$ and $p(b_1|M)$ represent prior probabilities of $b_0$ and $b_1$ and are equal to the normalized messages incoming from the block following demapper 210 in the signal processing path (e.g., decoder 220). If prior probabilities are not available, then prior probabilities of $b_0$ and $b_1$ are assumed to be uniformly distributed.

Through mathematical manipulation of the above factorized equation, a set of equations can be determined that uniquely defines the bit probabilities as functions of input data, noise parameters, and available prior information about bit values. In the present description, an approximate implementation of these relationships using transistor-based electronic circuits is described.

Figure 3A:
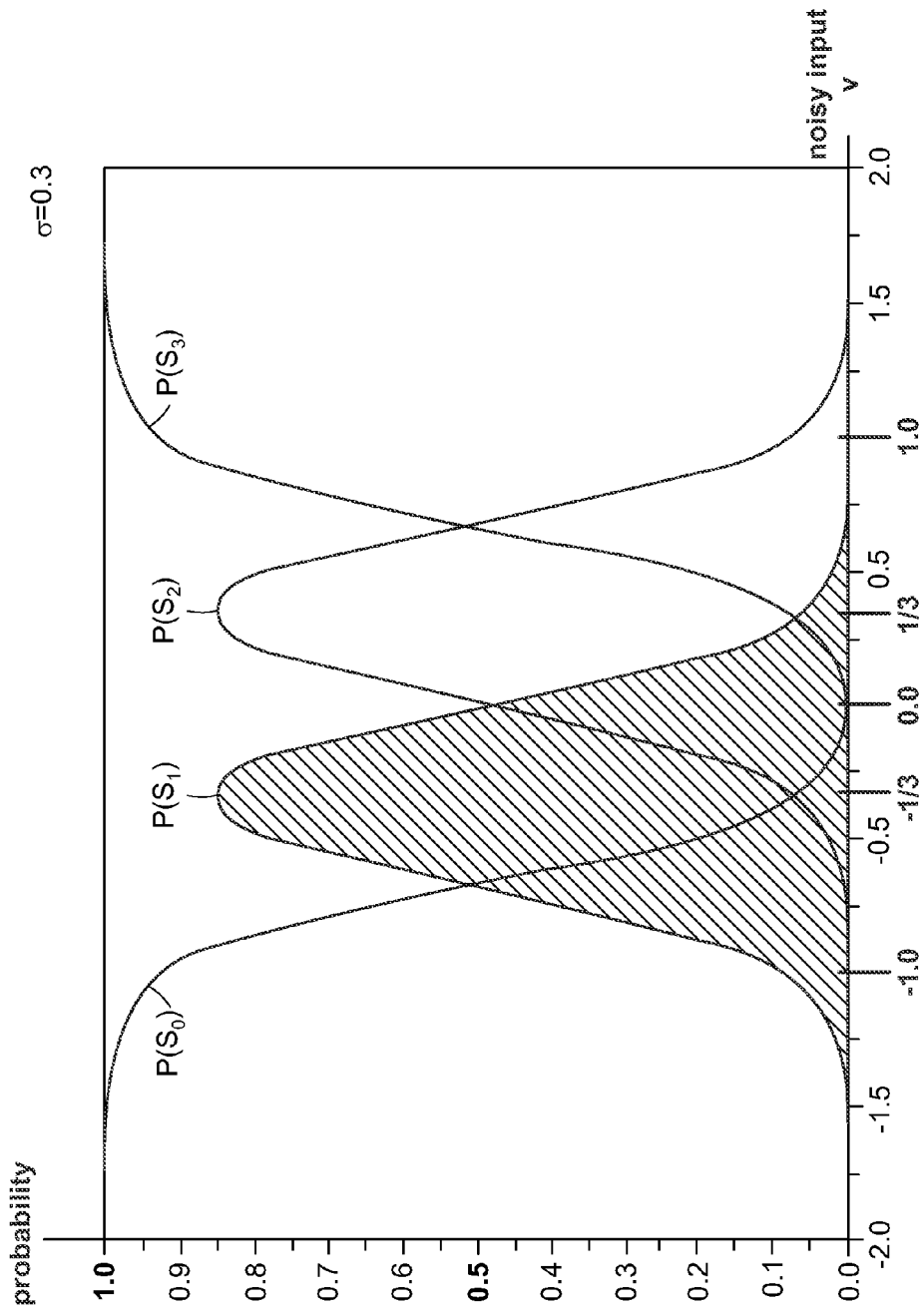
FIGS. 3A and 3B are plots of symbol likelihoods as a function of an input signal for two channels of different noise characteristics, respectively.

FIG. 3A shows a theoretical prediction of symbol likelihoods (e.g., a posteriori probabilities) as a function of the input value, assuming that the communication channel imposes an additive white Gaussian noise (AWGN; illustrated with a standard deviation of $\sigma=0.3$) on the transmitted data and that each symbol is equally likely to be transmitted. In particular, the AWGN can be represented as $$P(x) = \frac{1}{\sigma\sqrt{2\pi}} \exp\left(-\frac{(x-\mu)^2}{2\sigma^2}\right),$$

where $\sigma$ is the standard deviation and the mean, $\mu$, is assumed to be zero.

In this figure, there are four overlapping regions each defined by a respective symbol likelihood curve $P(S_k)$. Each $P(S_k)$ curve represents the probability of the transmitted symbol being $S_k$ conditioned on the input observation v. The symbol likelihood curves are determined from ratios of Gaussian distribution functions of v centered on the desired symbol location to the sum of the Gaussian distribution functions of v with means at each symbol location. Generally, the symbol likelihood curves fall into two categories. The first category includes monotonic (e.g., S-shaped) symbol likelihood functions that represent the probability of the end symbols ($S_0$ and $S_3$). The second category includes modal (e.g., bump-shaped although not necessarily symmetrical) symbol likelihood functions that represent the probability of the intermediate symbols ($S_1$ and $S_2$). Each of the modal curves has a peak output at (or near) the representative input value for the corresponding symbol. For example, the region enclosed by curve $P(S_1)$ (as the shaded region in the figure) has a mode positioned near input value $-\frac{1}{3}$, indicating that, given an observed input of $-\frac{1}{3}$, the transmitted symbol has about 85% chance of being symbol $S_1$. Probabilities of bits $b_0$ and $b_1$ can be determined by marginalization over the derived symbol likelihoods.

Note that in this example, the probability curves have been normalized. That is, at any input value, the sum of all four likelihoods $P(S_0)$ to $P(S_3)$ equals 1. This is not necessarily always true in other examples.

When data are transmitted over communication channels of different characteristics, the center locations of the likelihood curves $P(S_k)$ essentially remain close to the set of representative values already defined in the constellation. The shape of each curve, however, may change depending on noise characteristics.

Figure 3B:
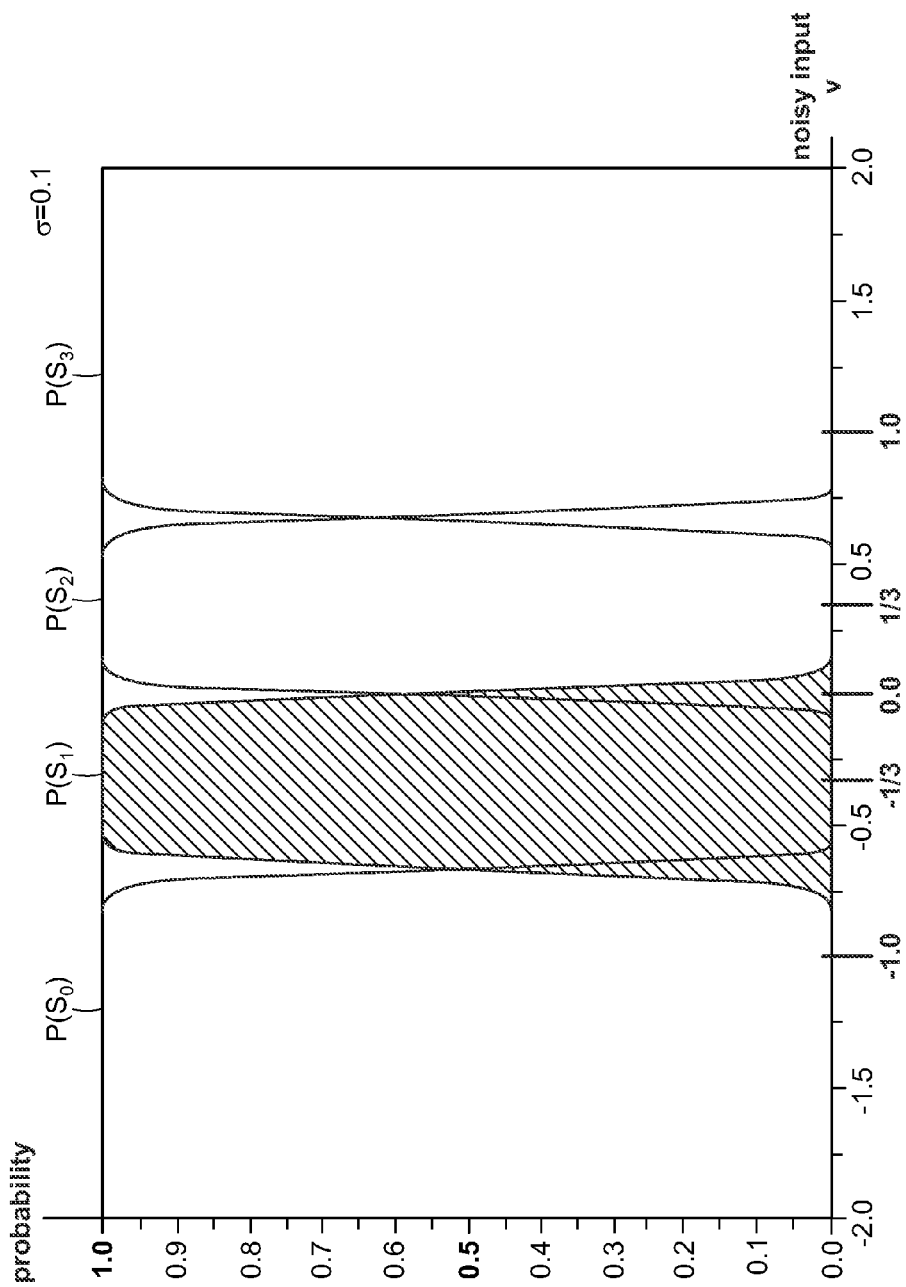

FIG. 3B, for example, shows another prediction of symbol likelihoods as a function of input when the communication channel has a Gaussian noise of smaller variance ($\sigma=0.1$). Here, each $P(S_k)$ curve exhibits a near-rectangular shape having a sharper side slope than the corresponding $P(S_k)$ curve previously shown in FIG. 3A. The overlapping between different regions has also been greatly reduced in this case. In other words, a cleaner channel allows for a more reliable determination of the preferred symbol for a given input. Note that in the opposite extreme, when $\sigma$ tends toward infinity (i.e., noise is uniformly distributed), all symbols are equiprobable with a probability of 1/M, for M symbols in the corresponding symbol constellation.

2 Symbol Likelihood Generator

The following section provides examples of a symbol likelihood generator configured using analog circuits to generate symbol likelihood functions that approximate the theoretical predictions of FIGS. 3A and 3B. As previously discussed, there are two categories of symbol likelihood functions, i.e., monotonic (e.g., S-shaped) functions representing the probability of end symbols and modal (e.g., bump-shaped) functions representing the probability of intermediate symbols. Circuits for providing these two types of transfer functions can be constructed, for example, by use of configurable sigmoid generators, as described in detail below.

In this description, the term "sigmoid generator" refers to circuit or circuit component whose transfer function forms or approximates a sigmoid function. Generally, a sigmoid function is real-valued and differentiable, having either a non-negative or a non-positive first derivative and exactly one inflection point (i.e., the point at which the second derivative of the function changes sign). There are two asymptotes for a sigmoid function, i.e., when input goes to positive and negative infinity. A sigmoid function can take various forms including, for example, the logistic function, the ordinary arc-tangent, the hyperbolic tangent, and the error function.

2.1 Circuit Providing Modal Transfer Functions

Figure 4:
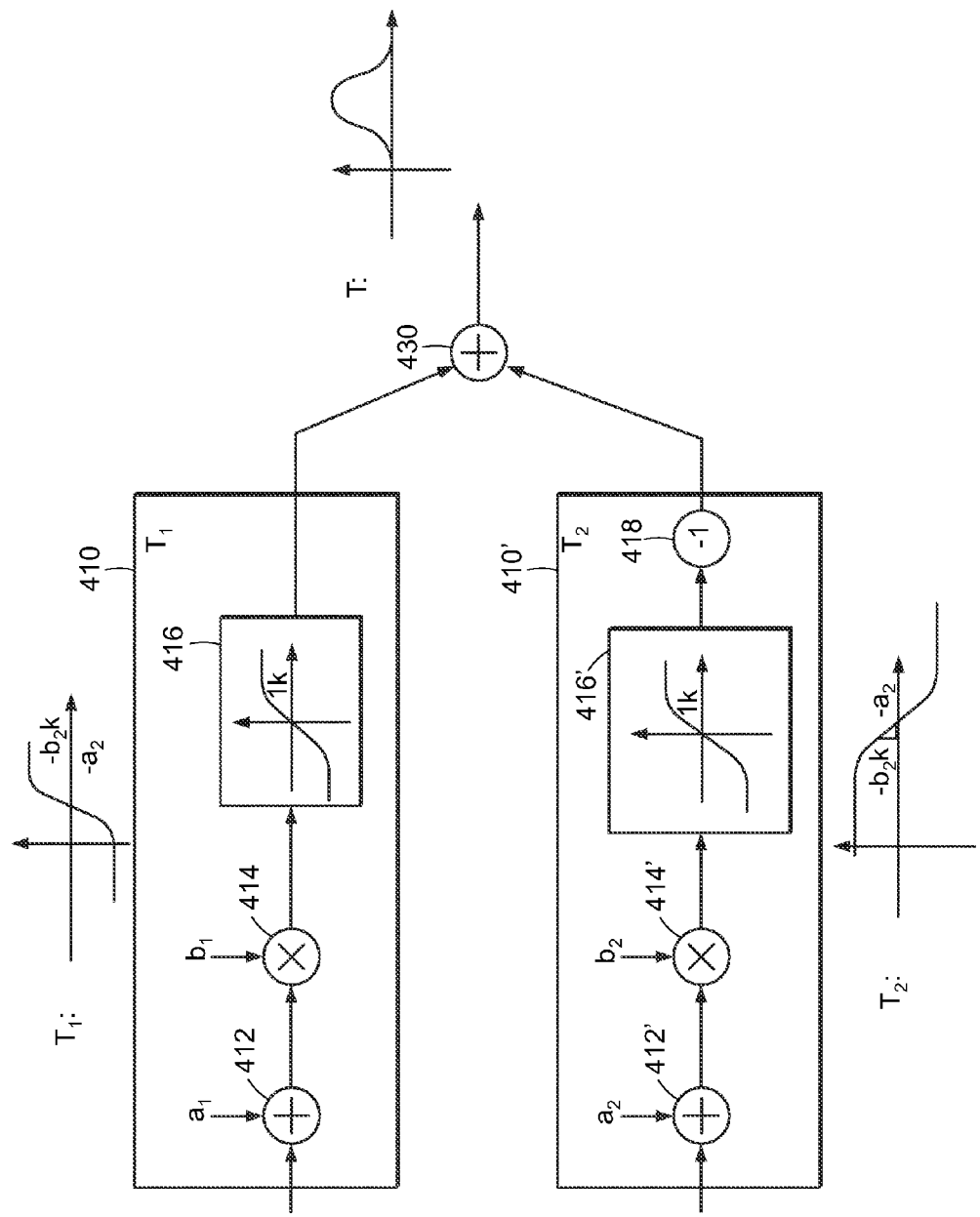
FIG. 4 illustrates one way of generating a bump-shaped transfer function using a pair of sigmoid generators.

FIG. 4 shows a block diagram of a circuit 400 that provides a modal transfer function as approximation of the symbol likelihood functions $P(S_1)$ and $P(S_2)$ of FIGS. 3A and 3B. Here, the circuit 400 includes a pair of configurable sigmoid generators 410 and 410' respectively configured to generate sigmoid functions $T_1(v)$ and $T_2(v)$ that are controllable by external parameters.

For example, the first configurable sigmoid generator 410 includes a core sigmoid generator 416 for providing a sigmoid function $S(v)$ (with its inflection point at the origin), a summer 412 for shifting the sigmoid function $S(v)$ by a distance of $a_1$ along the horizontal axis, and a multiplier 414 for changing a slope of the sigmoid function $S$ by a factor of $b_1$. In other words, the output transfer function $T_1$ of block 410 is a modified sigmoid function that has been shifted by $a_1$ and stretched/compressed by $b_1$, such that $T_1(v)=S((a_1+v)\cdot b_1)$.

Similarly, the second configurable sigmoid generator 410' generates a modified sigmoid function $T_2$ that has been shifted by $a_2$ and stretched/compressed by $b_2$, except that the output sigmoid function is also inverted by an inverter 418.

By combining the outputs of the first and second configurable sigmoid generators 410 and 410' in a summer 430, the circuit 400 produces an overall transfer function T that approximates the modal $P(S_1)$ and $P(S_2)$ of FIG. 3A, where $T(v)=S_1((a_1+v)\cdot b_1)-S_2((a_2+v)\cdot b_2)$ Here, the characteristics of the T curve can be controlled by adjusting the values of one or more of the four parameters $a_1$, $b_1$, $a_2$, and $b_2$, for example, to account for the effects of various channel noise on the transmitted signal. In some examples, the two configurable sigmoid generators 410 and 410' are configured to saturate at the same output level for scaling purposes.

Figure 5A:
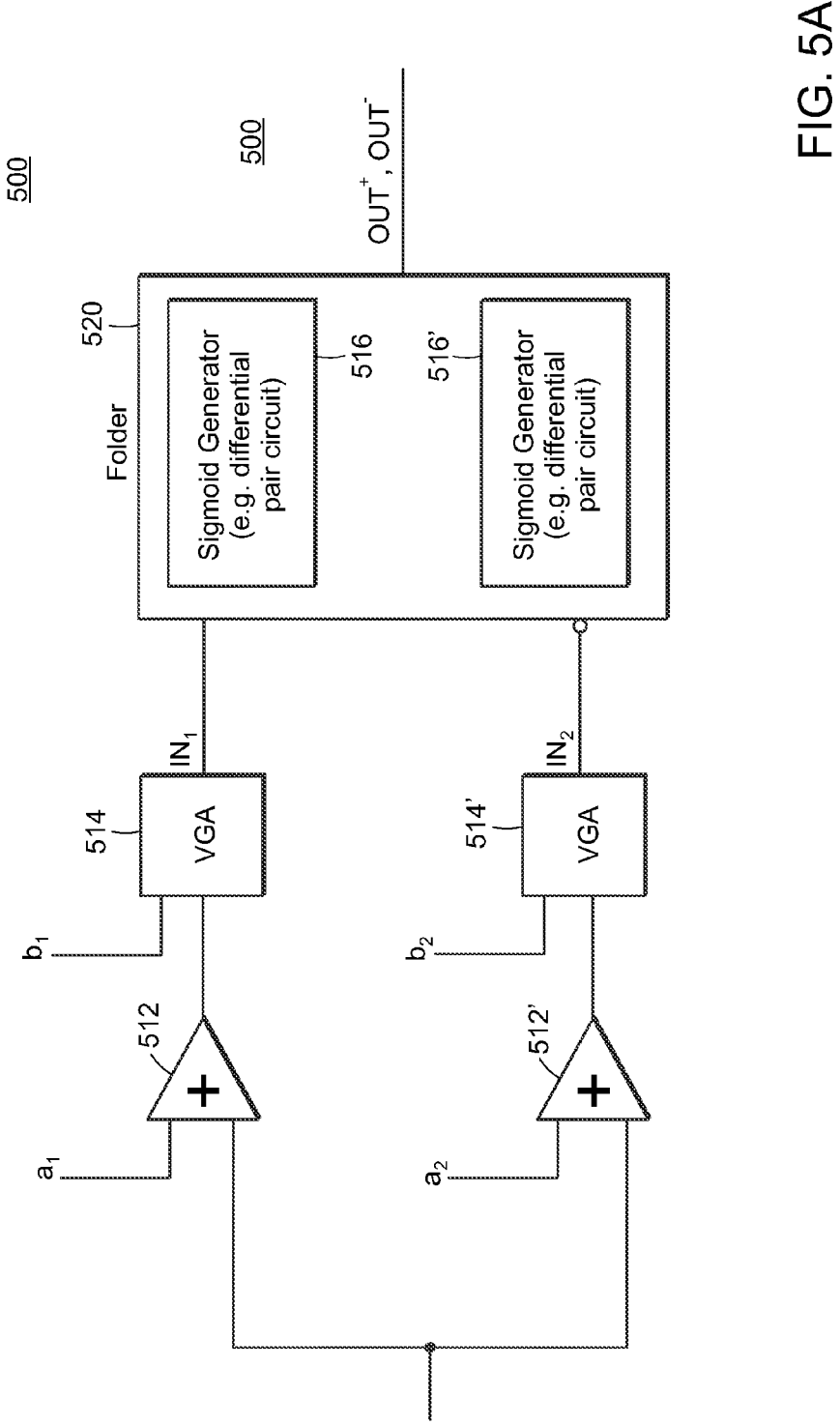
FIG. 5A is a block diagram of a circuit implementation that provides the transfer function of FIG. 4.

FIG. 5A shows a circuit structure 500 for one implementation of the circuit 400 shown in FIG. 4. In this example, the circuit 500 includes a folder 520 that employs a pair of sigmoid generators 516 and 516' (corresponding to blocks 416 and 416' of FIG. 4), which can be formed, for example, by using differential pair circuits. The circuit 500 also includes a pair of amplifiers 512 and 512' for introducing offset $a_1$ and $a_2$ to the transfer function T of FIG. 4, and a pair of variable gain amplifiers (VGA) 514 and 514' for adjusting the slopes of the transfer function T. Each one of the amplifiers 512 and 512', VGAs 514 and 514', and the folder 520 may be implemented using analog circuits. In other words, the input and output of the circuit 500 are both continuously variable signals (e.g., in the form of voltage or current signals).

Figure 5B:
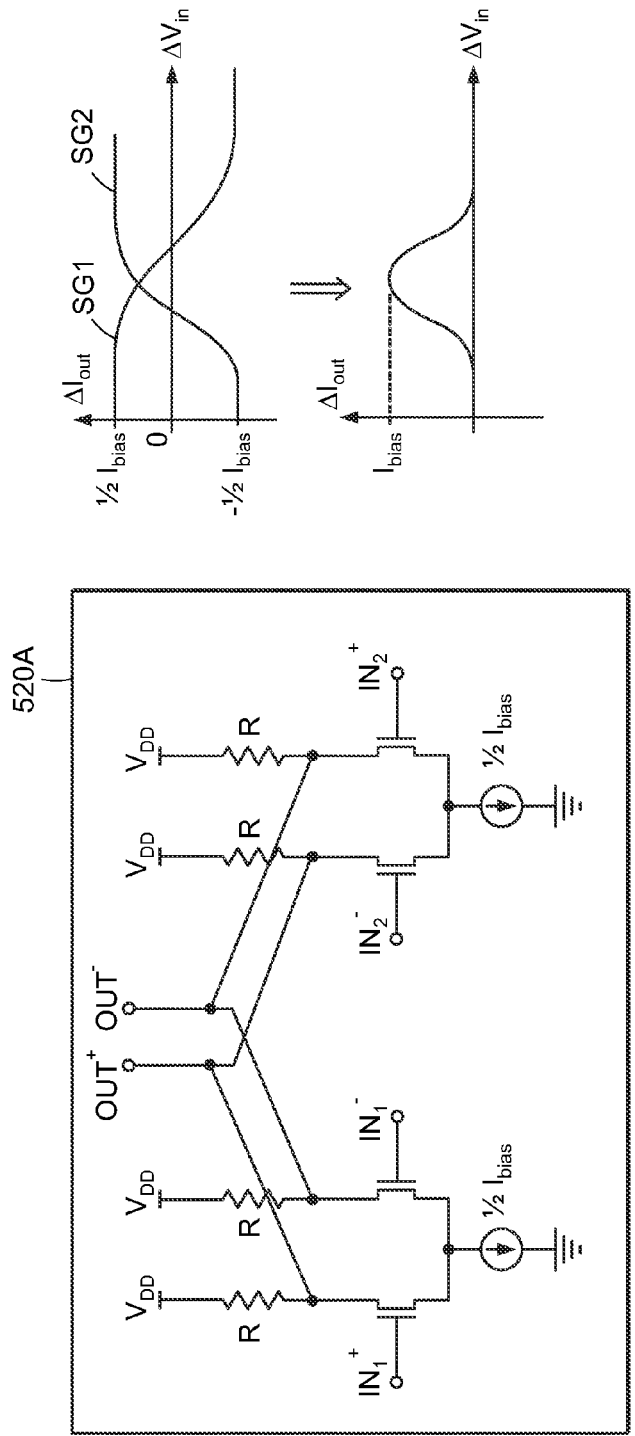
FIG. 5B is a circuit diagram of one example of the folder of FIG. 5A.

FIG. 5B shows one example of the folder 520 by use of a folding amplifier 520A. The folding amplifier 520A includes two differential pair circuits whose differential inputs have been offset relative to each other and whose output differential currents are subtracted. Each differential pair circuit includes three basic components: a pair of transistors $M_1$ and $M_2$, a pair of load resistors R, and a current source that sets the current (e.g., $\frac{1}{2}\cdot I_{bias}$) available for switching the transistors. The transfer function of a differential pair circuit has a sigmoid form and thus can be approximated by a variety of analytical and special functions.

For purposes of illustration, the transistors $M_1$ and $M_2$ take the form of MOSFET transistors in this figure although other types of transistors (such as bipolar junction transistors) can also be used. The MOSFET may operate in weak-inversion regime (i.e., sub-threshold mode), or alternatively, may operate in strong-inversion regime (i.e., above-threshold mode). The load R may be implemented in a variety of ways, including as discrete resistors, MOSFET transistors operating in a linear regime, or an additional current source.

In this example, the folding amplifier 520A uses fully differential signaling, i.e., each differential pair circuit accepts input in the form of differential voltage (e.g., $IN_1^+ - IN_1^-$) and generates output in the form of differential voltage/current current (e.g., $OUT^+ - OUT^-$). Differential signals are associated with a common mode, defined as $(IN_1^+ + IN_1^-)/2$ for the input ports of each differential pair circuit; a similar definition applies for the output ports. In general, the common mode level is maintained constant throughout the signal chain. Alternatively, the circuits may be designed to provide common mode rejection (i.e., to reduce the sensitivity of the circuit to common mode variations). For instance, differential pairs may be used with a fixed common mode set at $I_{bias}\cdot R/2$.

Figure 22A:
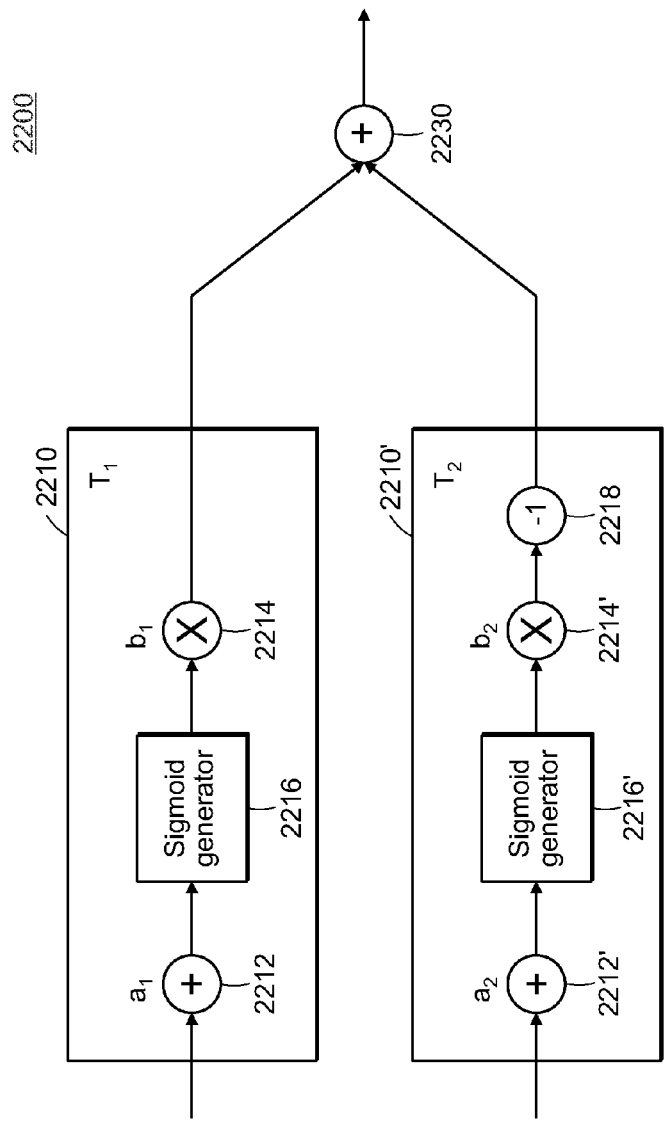
FIG. 22A illustrates a second embodiment for the generation of a bump-shaped transfer function using a pair of sigmoid generators.

FIG. 22A shows a block diagram of a second embodiment of a circuit 2200 that provides a modal transfer function as approximation of the symbol likelihood functions $P(S_1)$ and $P(S_2)$ of FIGS. 3A and 3B. Here, the circuit 2200 includes a pair of configurable sigmoid generators 2210 and 2210' respectively configured to generate sigmoid functions $T_1(v)$ and $T_2(v)$ that are controllable by external parameters.

For example, the first configurable sigmoid generator 2210 includes a core sigmoid generator 2216 for providing a sigmoid function $S(v)$ (with its inflection point at the origin), a summer 2212 for shifting the sigmoid function $S(v)$ by a distance of $a_1$ along the horizontal axis, and a multiplier 2214 for changing a slope of the sigmoid function $S$ by a factor of $b_1$. In other words, the output transfer function $T_1$ of block 2210 is a modified sigmoid function that has been shifted by $a_1$ and stretched/compressed by $b_1$, such that $T_1(v)=b_1S(a_1+v)$.

Similarly, the second configurable sigmoid generator 2210' generates a modified sigmoid function $T_2$ that has been shifted by $a_2$ and stretched/compressed by $b_2$, except that the output sigmoid function is also inverted by an inverter 2218.

By combining the outputs of the first and second configurable sigmoid generators 2210 and 2210' in a summer 2230, the circuit 2200 produces an overall transfer function T that approximates the modal $P(S_1)$ and $P(S_2)$ of FIG. 3A, where $T(v)=b_1S_1(a_1+v)-b_2S_2(a_2+v)$. Here, the characteristics of the T curve can be controlled by adjusting the values of one or more of the four parameters $a_1$, $b_1$, $a_2$, and $b_2$, for example, to account for the effects of various channel noise on the transmitted signal. In some examples, the two configurable sigmoid generators 2210 and 2210' are configured to saturate at the same output level for scaling purposes.

Figure 22B:
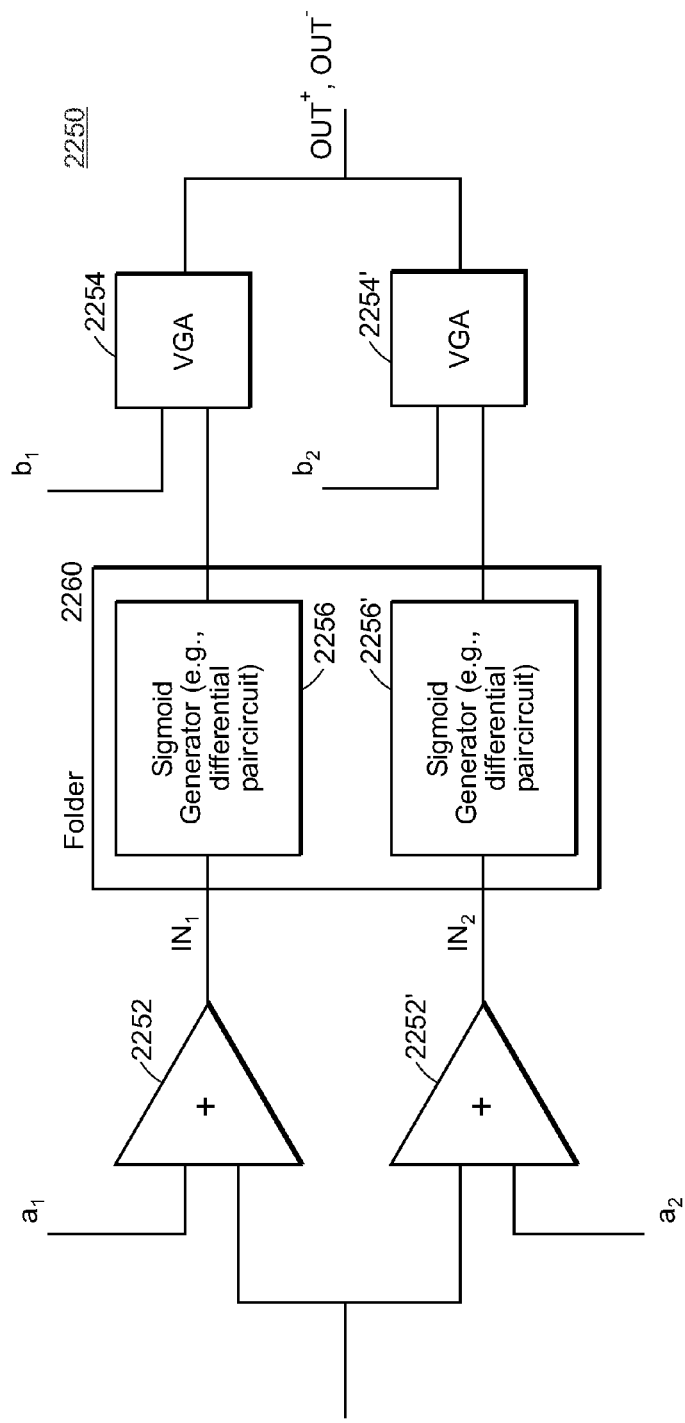
FIG. 22B is a block diagram of a circuit implementation that provides the transfer function of FIG. 22A.

FIG. 22B shows a circuit structure 2250 for one implementation of the circuit 2200 shown in FIG. 22A. In this example, the circuit 2250 includes a folder 2260 that employs a pair of sigmoid generators 2256 and 2256' (corresponding to blocks 2216 and 2216' of FIG. 22A), which can be formed, for example, by using differential pair circuits. The circuit 2250 also includes a pair of summers 2252 and 2252' for introducing offset $a_1$ and $a_2$ to the transfer function T of FIG. 22A, and a pair of variable gain amplifiers (VGA) 2254 and 2254' for adjusting the slopes of the transfer function T. Each one of the summers 2252 and 2252', VGAs 2254 and 2254', and the folder 2250 may be implemented using analog circuits such that the input and output of the circuit 2250 are both continuously variable signals (e.g., in the form of voltage or current signals). In some examples, folder 2250 is implemented as a folding amplifier such as folding amplifier 520A as shown in FIG. 5B.

Without limitation the examples here are described as using fully differential circuits for the purpose of consistency. Note that folding amplifiers using single-ended input are also possible, as long as the form of input and output signals are consistent with the operation of the rest of the circuit components. Furthermore, differential signaling may be advantageous because of its larger dynamic range and higher noise immunity than single-ended signaling. In some examples, it may be convenient to use current as output signals rather than to use voltage. In such cases, the last stage in signal processing that generates the output voltage is responsible for establishing the correct output common mode level.

Here, the differential output of the folder 520 (either as current-encoded or voltage-encoded signals) is configured to represent symbol likelihood $P(S_k)$ (e.g., k=1 or 2). In some examples, the amplitude of the differential output is in direct proportion to $P(S_k)$. In some other examples, with alternative implementations of the folder 520, the amplitude of the differential output may be linear to $P(S_k)$ with a DC offset.

2.2 Circuit Providing Monotonic Transfer Functions

Figure 6:
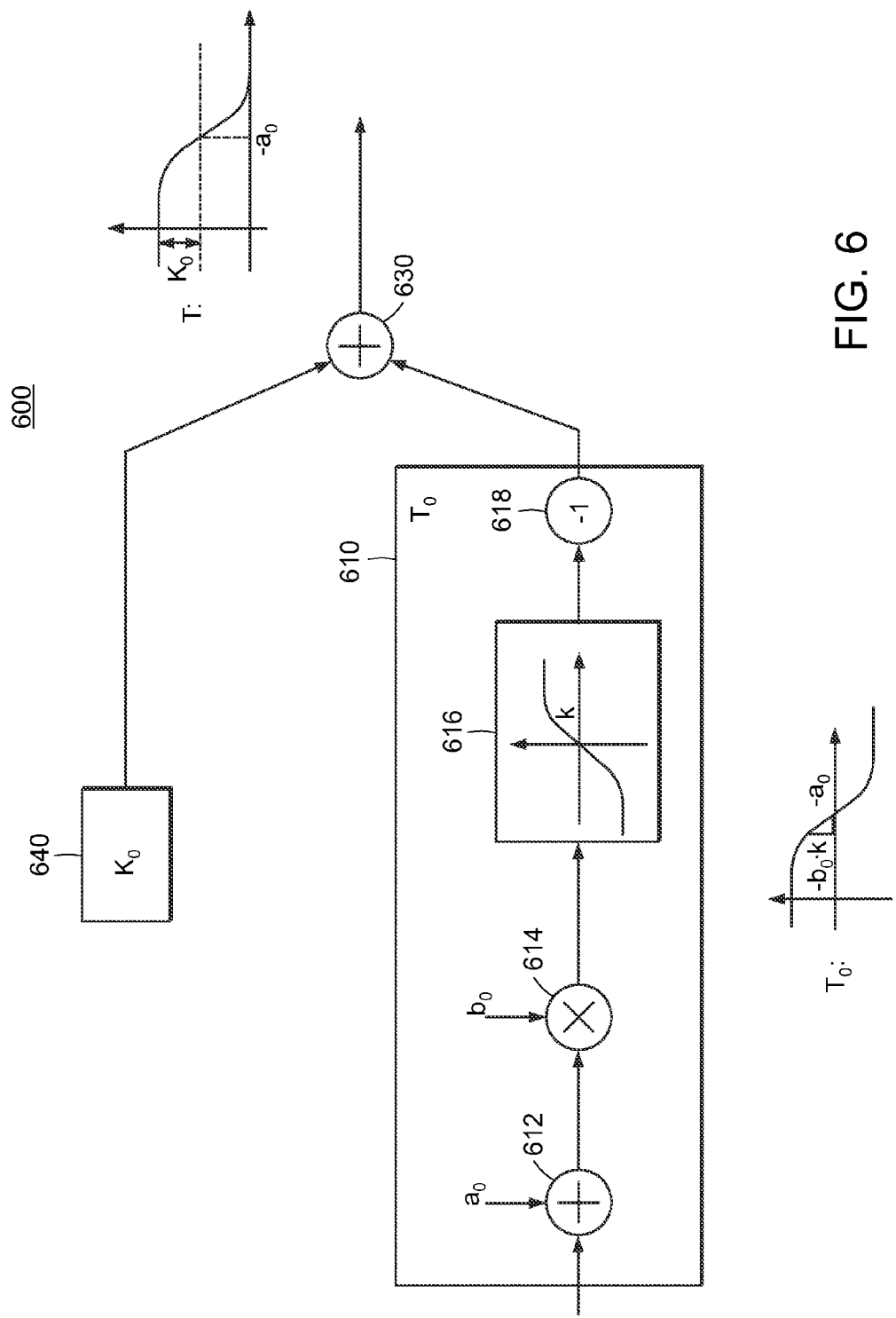
FIG. 6 illustrates one way of generating a shifted sigmoid transfer function using a sigmoid generator.

FIG. 6 shows a block diagram of a circuit 600 that provides an S-shaped transfer function that can be used to approximate the symbol likelihood functions $P(S_0)$ and $P(S_3)$ of FIGS. 3A and 3B. Here, the circuit 600 includes a configurable sigmoid generator 610 for generating sigmoid function $T_0$ that is controllable by external parameters, and a reference block 640 for shifting the sigmoid function $T_0$ along the vertical axis by a distance of $K_0$. Sigmoid generator 610 includes an amplifier 612 for introducing an offset $a_0$ to a sigmoid function generated by a generator 616, a variable gain amplifier 614 for adjusting the slope of the sigmoid function 616 by a factor $b_0$, and a circuit element 618 for inverting or multiplying the function to produce sigmoid function $T_0$. In some instances, circuit element 618 is an inverter; in other instances, element 618 is a configurable multiplier that multiplies the function by either +1 or −1. By combining the outputs of blocks 610 and 640 in a summer 630, the circuit 600 produces an overall transfer function T that approximates the S-shaped $P(S_0)$ and $P(S_3)$ of FIGS. 3A and 3B.

Figure 7A:
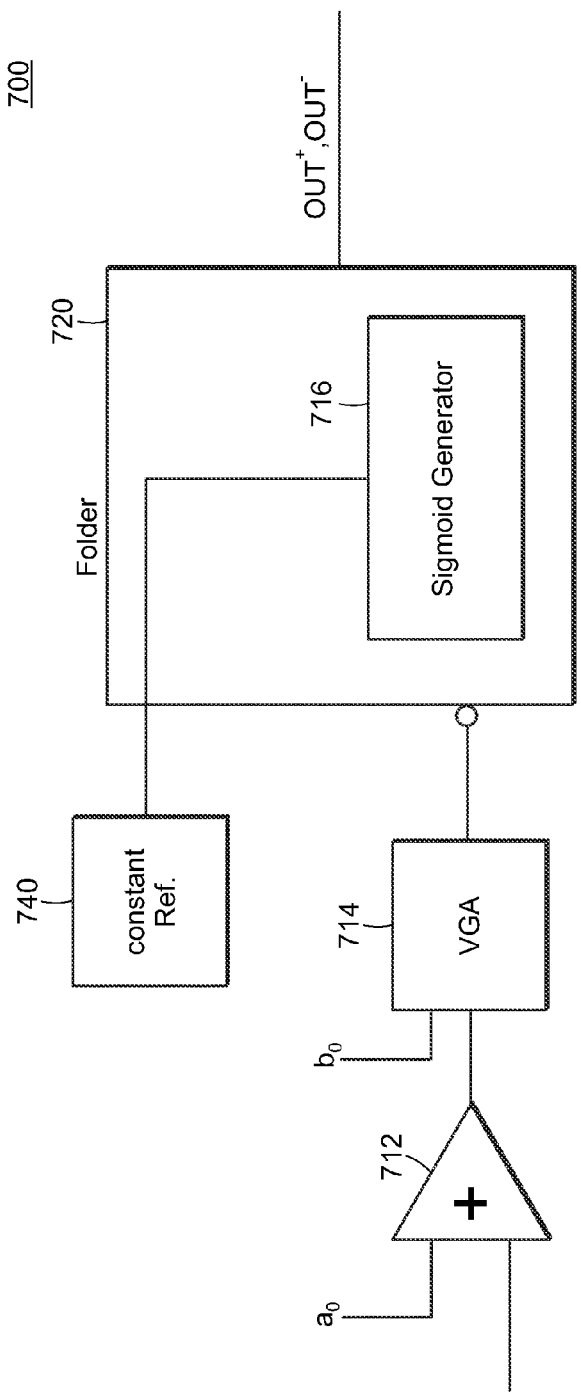
FIG. 7A is a block diagram of a circuit implementation that provides the transfer function of FIG. 6.

FIG. 7A shows a circuit structure 700 for one implementation of the circuit 600 shown in FIG. 6. In this example, the circuit 700 includes a folder 720 that employs a sigmoid generator 716 (corresponding to block 616 of FIG. 6), which can be formed, for example, by using differential pair circuits. A constant reference 740 (corresponding to block 640) is coupled to the sigmoid generator 716 for shifting the sigmoid output. The circuit 700 also includes an amplifier 712 for introducing input offset $a_0$, and a VGA 714 for adjusting the slope of the transfer function T of FIG. 6. Again, each one of the amplifier 712, VGA 714, and the folder 720 may be implemented using analog circuits. In other words, the input and output of the circuit 700 are both continuously variable signals.

Figure 7B:
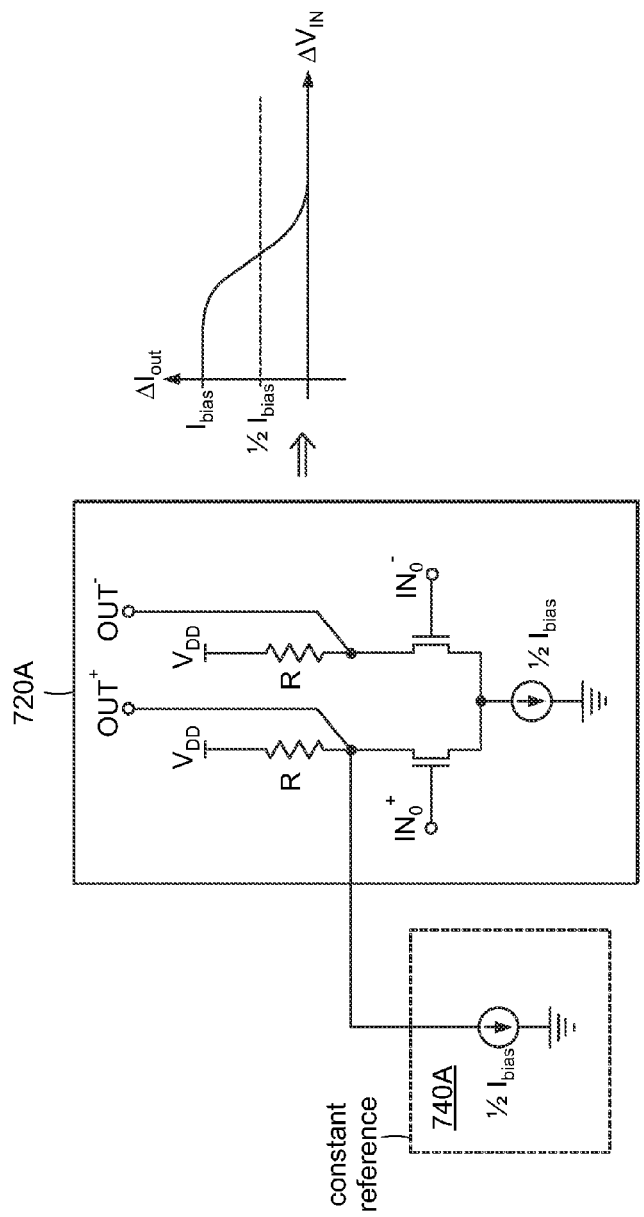
FIG. 7B is a circuit diagram of one example of the folder of FIG. 7A.

FIG. 7B shows one example of the folder 720 by use of a differential pair circuit 720A. The differential pair circuit 720A is coupled to a current source 740A, which serves as the constant reference 740 for shifting the output signal by a fixed amount. Here, by setting the current source 740A at the same level (i.e., $\frac{1}{2} \cdot I_{bias}$) as the current source inside the differential pair circuit 720A, the output of this folder can be shifted upward to be all positive while maintain the shape of the sigmoid. Note that, when desired, the direction of the shift can be reversed by replacing the fixed current source 740A with a fixed current sink coupled to the negative polarity output terminal. Again, the output of the folder 720 represents symbol likelihood $P(S_k)$ (e.g., k=0 or 3), either in direct proportion or alternatively in linear relationship with a DC offset.

Another example of the folder 720 that provides a shifted sigmoid function can be configured using the folding amplifier 520 of FIG. 5B by setting one set of the differential input signals to be constant. In other words, one of the differential pair circuit effectively functions as a current source coupled to the other differential pair circuit.

A third example of the folder 720 (not shown) implements an alternative differential pair circuit that by itself produces a non-negative sigmoid output that is in proportion to the symbol likelihood $P(S_k)$.

Figure 23A:
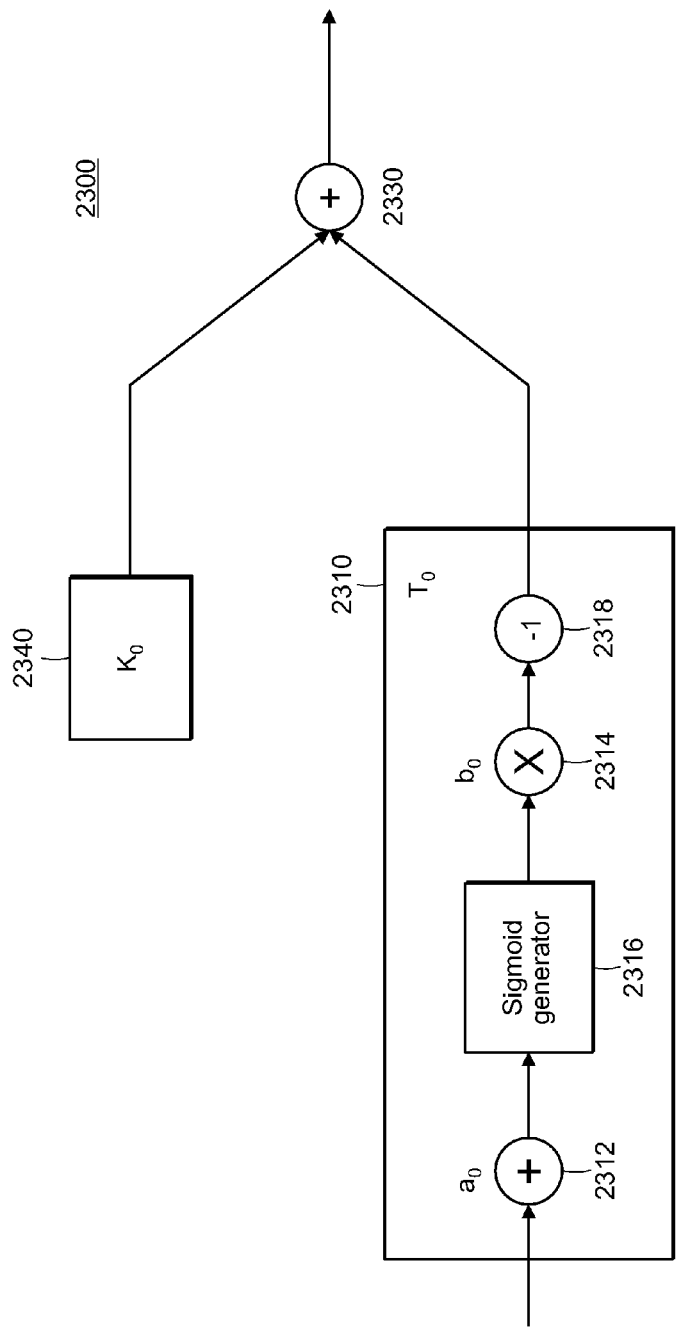
FIG. 23A illustrates a second embodiment for the generation of a shifted sigmoid transfer function using a sigmoid generator.

FIG. 23A shows a block diagram of another embodiment of a circuit 2300 that provides an S-shaped transfer function that can be used to approximate the symbol likelihood functions $P(S_0)$ and $P(S_3)$ of FIGS. 3A and 3B. Here, the circuit 2300 includes a configurable sigmoid generator 2310 for generating sigmoid function $T_0$ that is controllable by external parameters, and a reference block 2340 for shifting the sigmoid function $T_0$ along the vertical axis by a distance of $K_0$. Sigmoid generator 610 includes an amplifier 2312 for introducing an offset $a_0$ to a sigmoid function generated by a generator 2316, a variable gain amplifier 2314 for adjusting the slope of the sigmoid function 2316 by a factor $b_0$, and a circuit element 2318 for inverting or multiplying the function to produce sigmoid function $T_0$. In some instances, circuit element 2318 is an inverter; in other instances, element 2318 is a configurable multiplier that multiplies the function by either +1 or −1. By combining the outputs of blocks 2310 and 2320 in a summer 2330, the circuit 2300 produces an overall transfer function T that approximates the S-shaped $P(S_0)$ and $P(S_3)$ of FIGS. 3A and 3B.

Figure 23B:
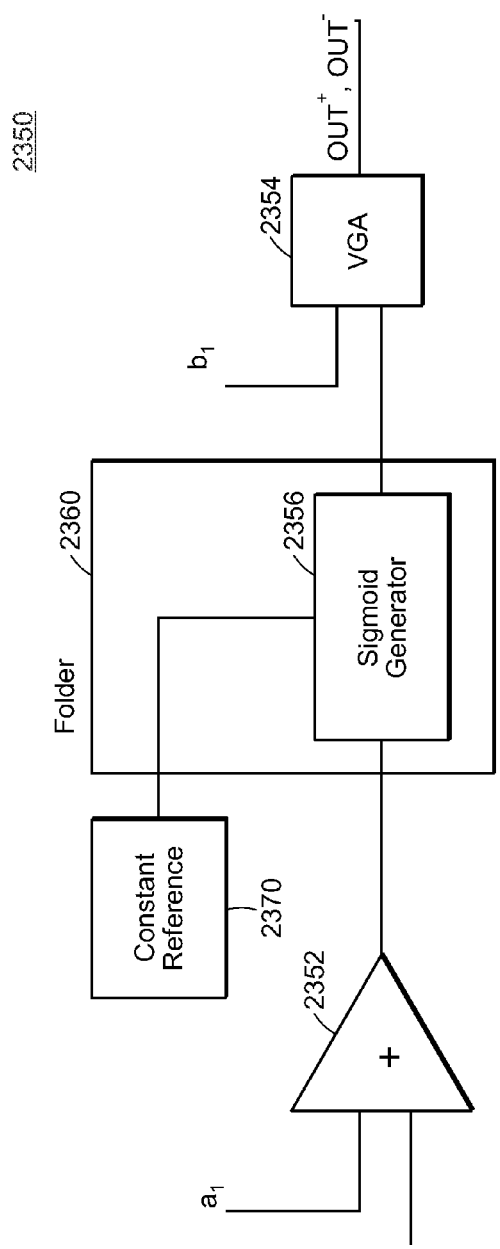
FIG. 23B is a block diagram of a circuit implementation that provides the transfer function of FIG. 23A.

FIG. 23B shows a circuit structure 2350 for one implementation of the circuit 2300 shown in FIG. 23A. In this example, the circuit 2350 includes a folder 2360 that employs a sigmoid generator 2356 (corresponding to block 2316 of FIG. 23A), which can be formed, for example, by using differential pair circuits. A constant reference 2370 (corresponding to block 2340) is coupled to the sigmoid generator 2356 for shifting the sigmoid output. The circuit 2350 also includes an amplifier 2352 for introducing input offset $a_0$, and a VGA 2354 for adjusting the slope of the transfer function T of FIG. 23A. Again, each one of the amplifier 2352, VGA 2354, and the folder 2360 may be implemented using analog circuits. In other words, the input and output of the circuit 2350 are both continuously variable signals. In some instances, folder 2360 is implemented with a differential pair circuit such as differential pair circuit 720A as shown in FIG. 7.

2.3 Exemplary Circuit for Symbol Likelihood Generator

Figure 8:
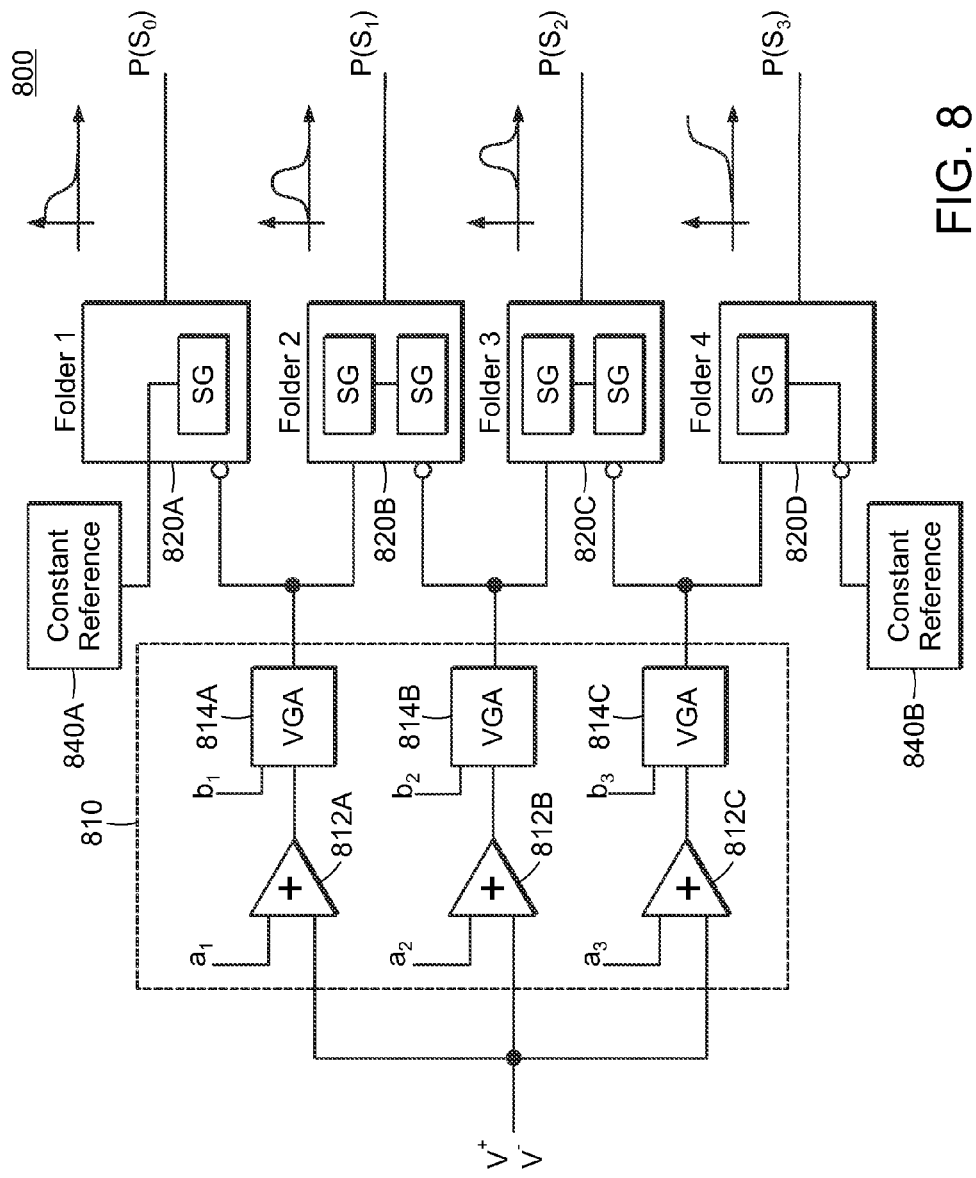
FIG. 8 is a block diagram of one embodiment of a symbol likelihood generator.

FIG. 8 shows an exemplary circuit structure 800 for a symbol likelihood generator that makes use of the circuit techniques described above. The symbol likelihood generator accepts a differential input $v^+$, $v^-$ and generates a set of outputs $P(S_0)$ to $P(S_3)$ each of which represents a probability of the input being associated with a corresponding symbol.

More specifically, this symbol likelihood generator 800 includes a set of folders 820A-D, each being responsive to the input of the symbol likelihood generator. Each folder includes one or two sigmoid generators (shown as SGs). Each SG is responsive to an input of the corresponding folder to generate an output that represents a sigmoid function S of that input. Each folder also includes circuitry (e.g., a summer) for combining the outputs of its SG(s) to form a corresponding one of the outputs $P(S_k)$.

The symbol likelihood generator 800 also includes an input transformation circuit 810 coupled to the set of folders for transforming the input $v^+$, $v^-$. The input transformation circuit 810 includes a set of amplifiers 812A-812C and a set of VGAs 814A-814C that can be used to adjust the outputs of the symbol likelihood generator 800 to emulate parametric dependence of symbol likelihood functions on channel noise (e.g., dependence on $\sigma$).

Figure 24:
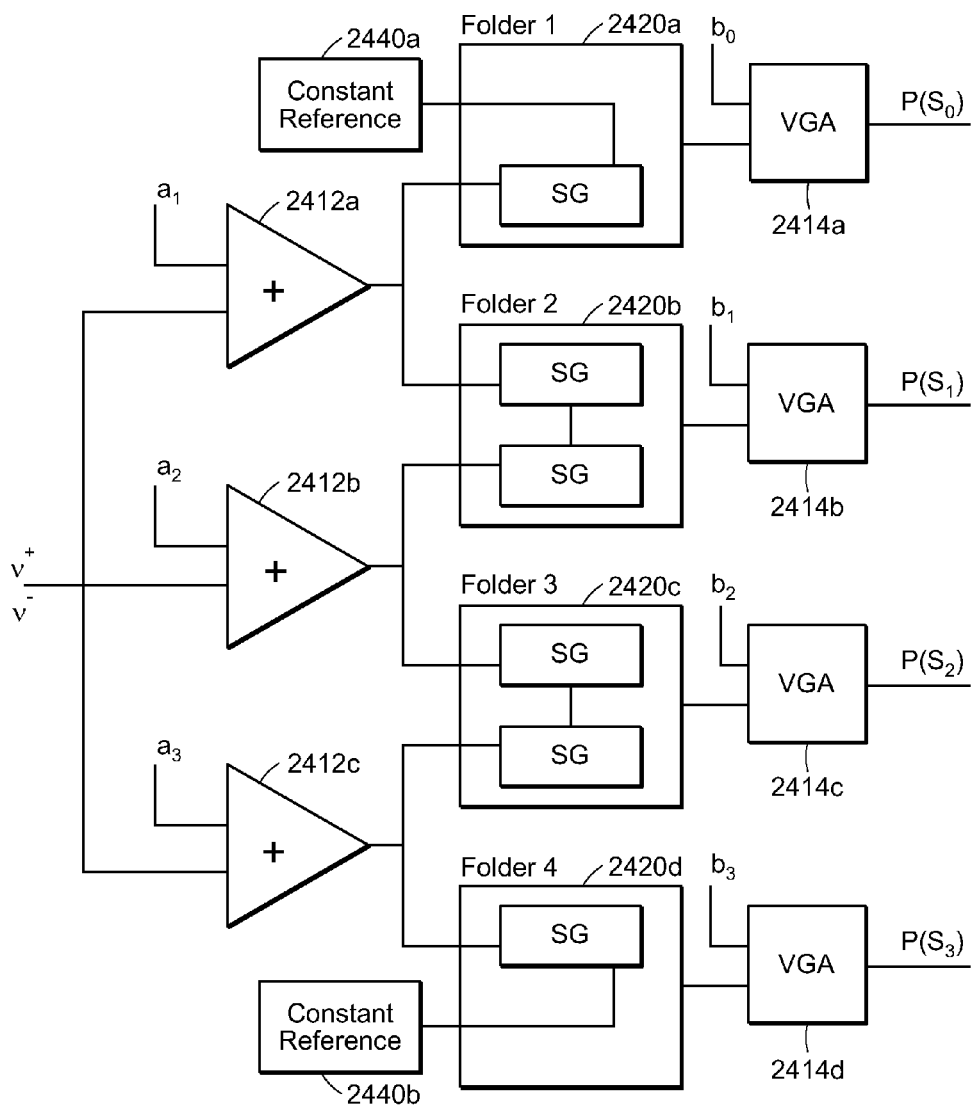
FIG. 24 is a block diagram of a second embodiment of a symbol likelihood generator.

FIG. 24 shows an alternative embodiment of a circuit structure 2400 for a symbol likelihood generator that makes use of the circuit techniques described above. The symbol likelihood generator accepts a differential input $v^+$, $v^-$ and generates a set of outputs $P(S_0)$ to $P(S_3)$ each of which represents a probability of the input being associated with a corresponding symbol.

More specifically, symbol likelihood generator 2400 includes a set of folders 2420A-D, each being responsive to the input of the symbol likelihood generator. Each folder includes one or two sigmoid generators (shown as SGs). Each SG is responsive to an input of the corresponding folder to generate an output that represents a sigmoid function S of that input. Each folder also includes circuitry (e.g., a summer) for combining the outputs of its SG(s) to form a corresponding one of the outputs $P(S_k)$.

The symbol likelihood generator 2400 also includes a set of amplifiers 2212A-2212C coupled to the set of folders for transforming the input $v^+$, $v^-$. Furthermore, a set of VGAs 2414A-2414C are used to adjust the outputs of the symbol likelihood generator 2400 to emulate parametric dependence of symbol likelihood functions on channel noise (e.g., dependence on $\sigma$).

3 Bit Probability Generator

Once the symbol likelihoods $P(S_0)$ to $P(S_3)$ are generated for a given input, the bit probabilities can be computed also in an analog manner, for example, by signal summation.

Figure 9:
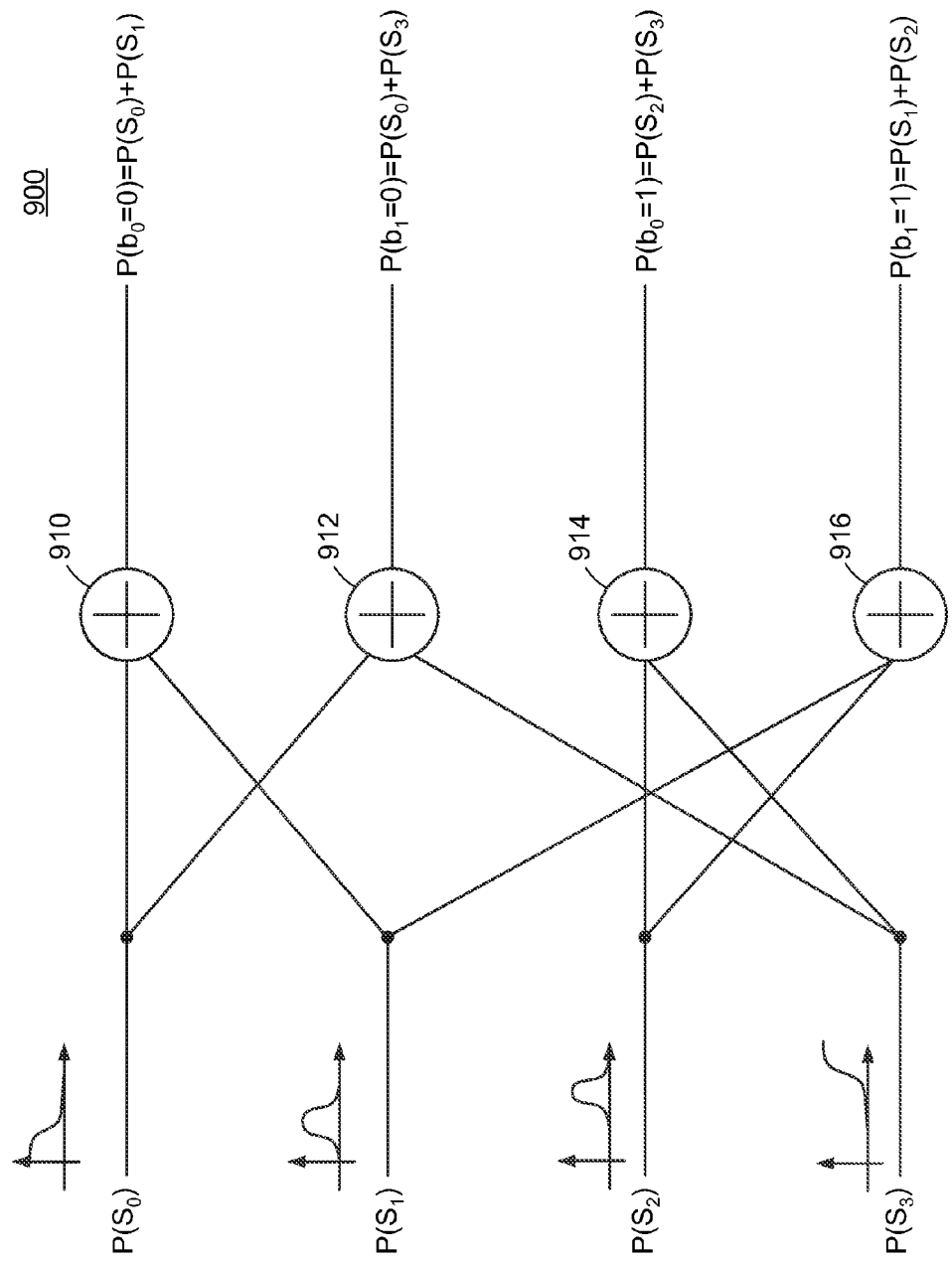
FIG. 9 is a block diagram of one embodiment of a bit probability generator for use with the symbol likelihood generator of FIG. 8.

FIG. 9 shows a block diagram of one example of a bit probability generator 900 for use with the symbol likelihood generator of FIG. 8. Based on the Gray-code constellation previously shown in FIG. 2, the bit probabilities can be obtained from symbol likelihoods as the following:

$$P(b_0=0)=P(S_0)+P(S_1) \quad (1a)$$

$$P(b_0=1)=P(S_2)+P(S_3) \quad (1b)$$

$$P(b_1=0)=P(S_0)+P(S_3) \quad (1c)$$

$$P(b_1=1)=P(S_1)+P(S_2) \quad (1d)$$

Each of the four equations can be performed in a respective one of the summers 910, 912, 914, and 916.

Note that, because of inherent constraints, not all four computations of (1a)-(1d) need to be performed in order to obtain bit probabilities. For example, in cases of binary coding, it is known that the probability of bit $b_i$ being 1 and the probability it being 0 adds up to 100%, meaning that, once $P(b_i=0)$ is obtained, $P(b_i=1)$ is also known. Thus, the bit probability generator 900 may be reduced to a set of two summers (e.g., 910 and 912) for generating $P(b_0=0)$ and $P(b_1=0)$.

In analog circuit implementations, the input and output of the bit probability generator 900 can be presented as voltages, or alternatively, as currents. In some applications, it may be useful to use current signals because summation in current form is easy to achieve using Kirchhoff's Current Law. In such cases, as a symbol likelihood may be used more than once in computing different bit probabilities, multiple copies of the same current representing symbol likelihood may be desired. There are several ways to replicate current signals in analog design. One example is to use identical unity gain buffers driven by the same signal. Another example is to implement replication in current domain via current mirrors.

Figure 10:
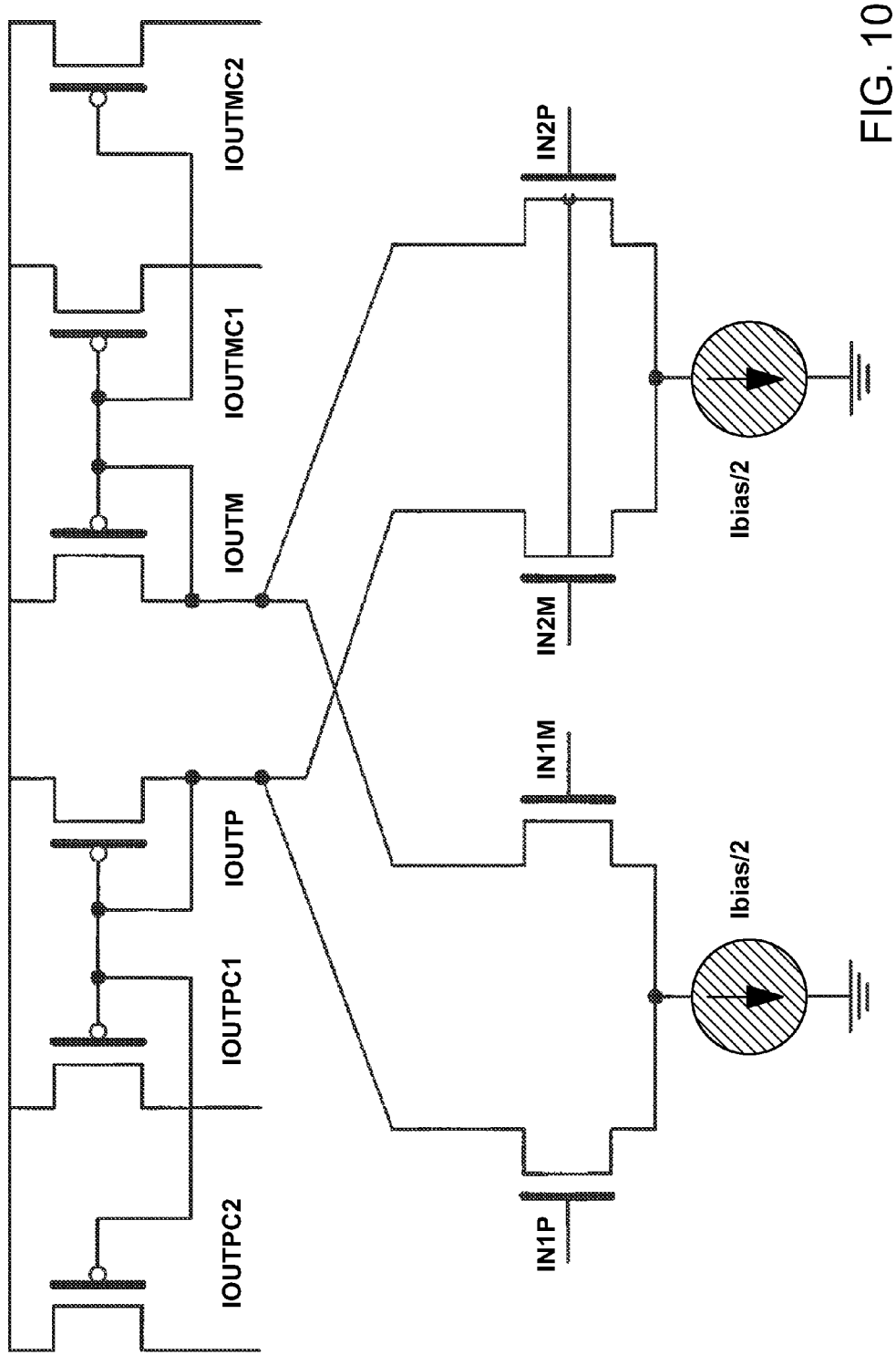
FIG. 10 is a circuit diagram for generating multiple copies of a current signal.

FIG. 10 provides an exemplary circuit that uses a current mirror structure to generate multiple copies of a current signal for further summation. Here, the outputs of the symbol likelihood generator (or the output of the folders) are taken in current form rather than in voltage form.

Figure 11A:
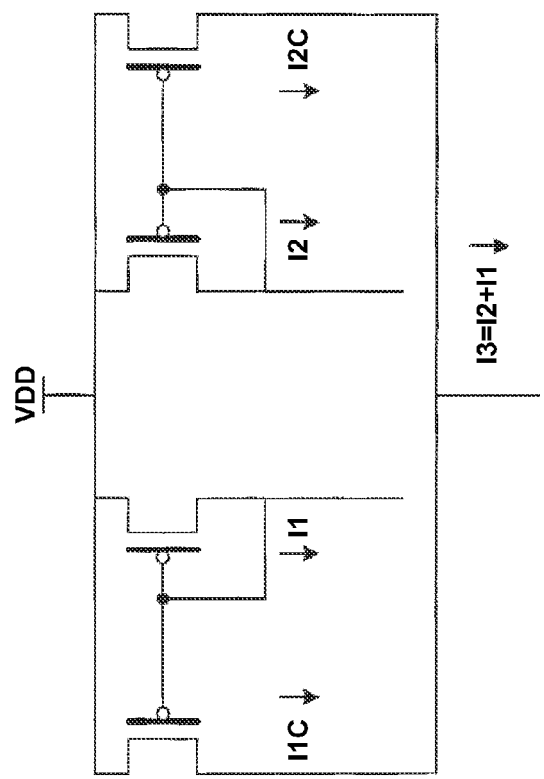
FIGS. 11A and 11B illustrate a current summation circuit.
Figure 11B:
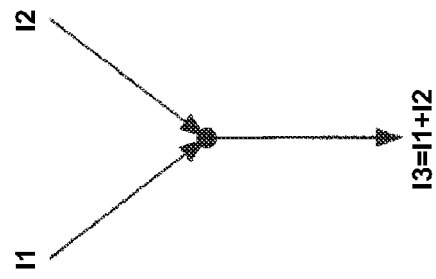

For purposes of illustration, the combination of differential pairs with input IN1P, IN1M and IN2P, IN2M implements one folding amplifier (e.g., the folder 820B of FIG. 8). IOUTP and IOUTM are the output currents of the folding amplifier. IOUTPC1, IOUTPC2 and IOUTMC1, IOUTMC2 constitute two copies of the IOUTP and IOUTM signals respectively derived via "current mirroring" operation. FIG. 11A shows an exemplary circuit for generating the summation $I_3$ of two current signals $I_1$ and $I_2$. FIG. 11B illustrates the use of Kirchhoff's Current Law in this current summation.

4 Extensions and Applications

In this description, although the circuit examples are illustrated primarily in the context of using analog circuits to implement a soft demapper function that operates on PAM modulated signals, the general techniques can be easily applied to many other applications, some of which are described below.

4.1 Mapping of the Analog Domain to the Probability Domain

One application relates to signal mapping of the analog domain to the probability domain, such as mapping of analog signals (e.g., currents and voltages) to the probabilities of symbols and/or digital bits. Such mappings can be useful, for example, in cases where the analog signals contain prominent noise components such that probability measures of bit estimates can provide valuable information for the subsequent signal processing and/or error correction.

Generalizing from this communication example, any observed variable (a pixel intensity, a genome base pair, etc.) can be treated as a transmitter and any noise in the observation can be treated as a channel. Any observed variable (even a real number) can be considered to be in one of a set of discrete states. In the example of a genome base pair, there are 4 possible states G, C, T, A. A single electron transistor measuring can measure the conformation of a nearby DNA transcriptase, but this will be a noisy measurement. Therefore the received signal will be one of 4 discrete voltage levels with noise added. In another example, one may desire to observe a real valued variable that is known to have a limited dynamic range and which we wish to know to a given resolution. We could consider this variable to be in one of a possibly large number of discrete states. Noise in the measurement would again act as a channel, and the demapper would produce a probability or likelihood that the variable is in each of the possible states.

4.2 QAM and N-Dimensional Constellation

A second application relates to the implementation of a soft demapper function on QAM (quadrature amplitude modulation) modulated signals, or more generally, signals modulated based on an N-dimensional constellation.

Generally, QAM provides a way to create complex modulated signals for data transmission using two mathematically orthogonal signals, for example, sine and cosine. In this case, transmitted signal can be expressed as $I(t) \cdot \sin(\omega t) + Q(t) \cdot \cos(\omega t)$, where $I(t)$ and $Q(t)$ are referred to as the quadrature components of the signal.

Figure 12:
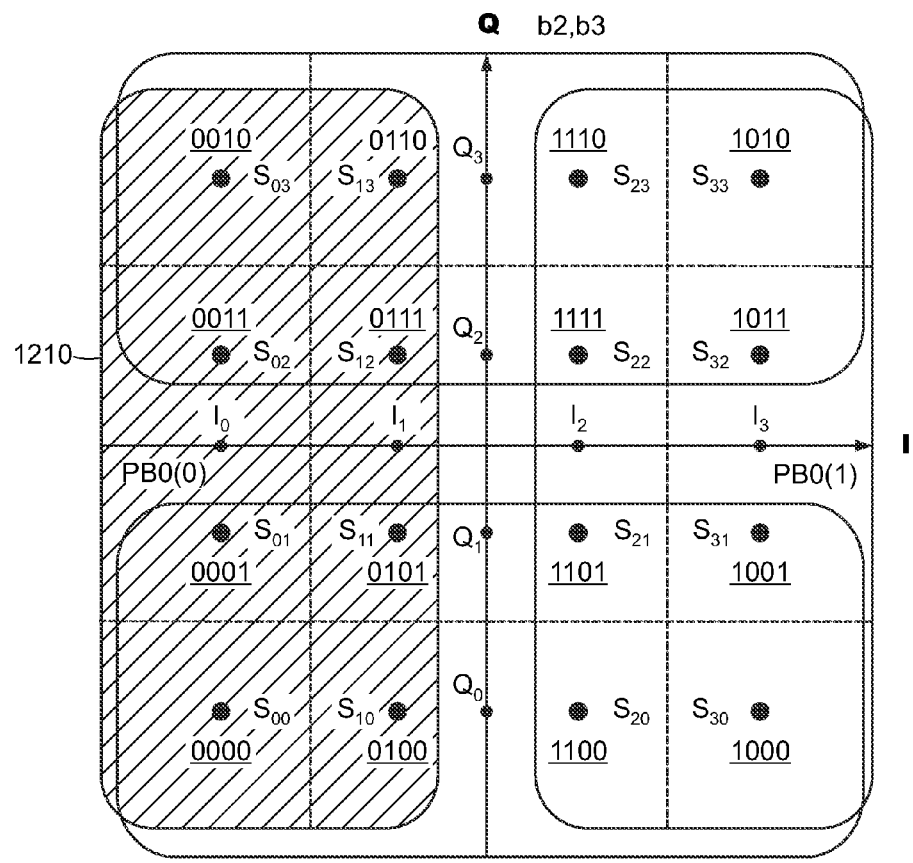
FIG. 12 illustrates a quadrature amplitude modulation (QAM) constellation.

FIG. 12 shows a QAM constellation using Gray coding. In this two-dimensional constellation, adjacent symbols differ from each other by no more than one bit in any position. For purposes of illustration, the transmission of a QAM symbol $S_{IQ}$ can be viewed as the transmission of two PAM symbols I and Q over two separate channels. Each PAM symbol has four levels (e.g., $I_0$, $I_1$, $I_2$, and $I_3$) mapped to two bits (e.g., $b_0$ and $b_1$). The resulting QAM symbol has sixteen levels ($S_{00}$ to $S_{33}$) mapped to four bits ($b_0$, $b_1$, $b_2$, and $b_3$).

Assume that channel noise, such as additive white Gaussian noise, affects the I and Q components of the signal in an uncorrelated fashion, or in other words, the transmission of I and Q are independent. The symbol likelihood of each symbol $S_{IQ}$ in the QAM constellation can then be obtained as a product of the symbol likelihoods for the corresponding symbols I and Q in PAM constellations, such as $P(S_{1,3})=P(I_1) \cdot P(Q_3)$. Thus, the computation of symbol likelihoods for QAM constellation can be reduced to the independent computations of symbol likelihoods for PAM constellations for each of the I and Q components (e.g., using the symbol likelihood generator 212 of FIG. 2).

Figure 13:
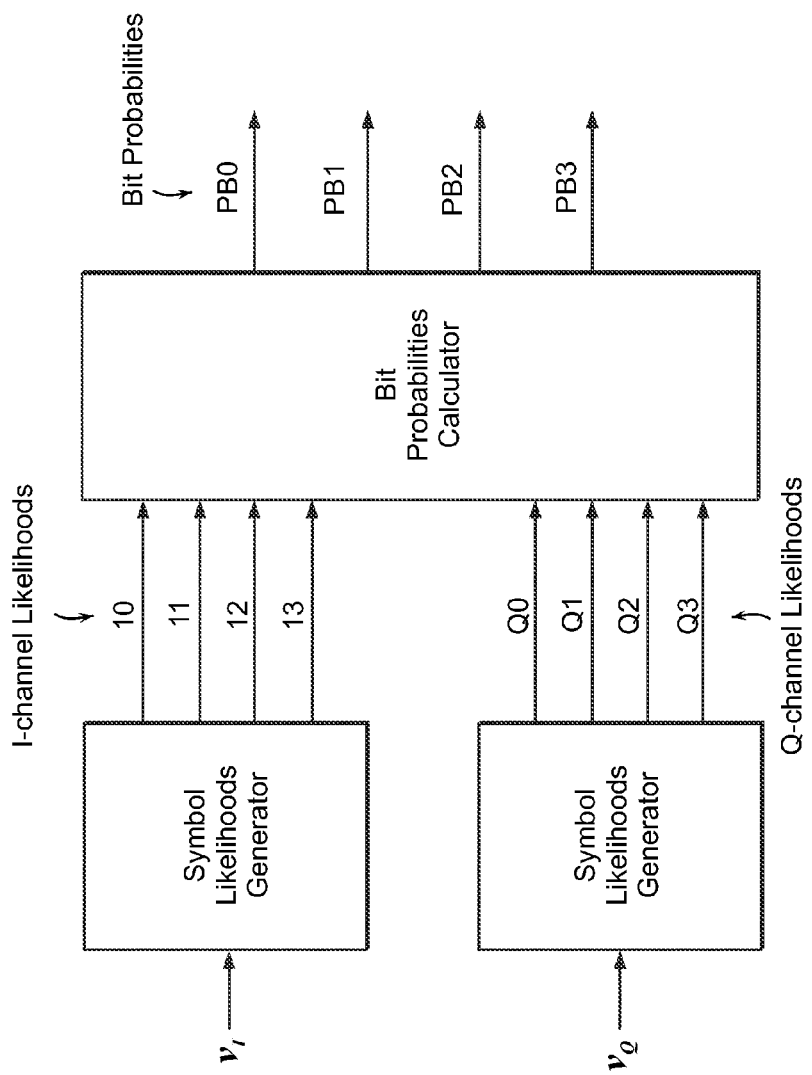
FIG. 13 illustrates another embodiment of a symbol likelihood generator for use with the QAM constellation of FIG. 12.

FIG. 13 shows one example of a demapper circuit configured to generate symbol likelihoods independently from input $v_I$ and $v_Q$ transmitted over separate channels.

Here, once the symbol likelihoods are obtained, bit probabilities can be computed as a marginal sum over the set of symbol likelihoods of the QAM constellations that contain the corresponding values of the selected bit. In a general case, the probability of bit $b_i$ having value "1," for example, can be obtained as:

$$P(b_i = 1) = \sum_{\substack{j \in J \\ k \in K}} P(I_j) \cdot P(Q_k) \qquad (2)$$

where J and K are the sets of all symbols from QAM constellation that contain value "1" of bit $b_i$, and $P(I_j)$ and $P(Q_k)$ are the respective symbol likelihoods of symbols $I_j$ and $Q_k$.

In some examples, constellations are formed in a particular manner to simplify the computation of equation (2), for example, to avoid or reduce direct multiplication. Note that if the sum of equation (2) contains terms that include products of particular symbols from one PAM constellation and all symbols of the other PAM constellation, then by applying simple normalization constraint (i.e., the sum of probabilities of all possible states of a random variable is 1) and the distributive law, equation (2) can be rewritten as the following:

$$P(b_i = 1) = \sum_{j \in J_i} P(I_j) \text{ for } i = 0 \text{ and } 1 \qquad (3)$$

$$P(b_i = 1) = \sum_{k \in K_i} P(Q_k) \text{ for } i = 2 \text{ and } 3$$

In the example of the Gray-coded constellation of FIG. 12, the probability of bit $b_0$ being "0" can thus be obtained by summing over all the constellation symbol likelihoods contained in the gray area 1210, or in other words, by summing over areas of $I_0$ and $I_1$. Accordingly, the probability of $b_0$ being "1" can be computed by summing over areas of $I_2$ and $I_3$.

As Gray coding is not a unique representation, there exist other representations for Gray-coded QAM constellation. Also, other coding techniques may also be used in developing the constellation. Without loss of generality, equations (2) and (3) can be extended to bit probability computations for any multidimensional constellation by choosing appropriate sets of symbol likelihoods for marginalization. In general, the separation of symbol likelihood computation and bit probability computation allows for the circuitry to be flexibly reconfigured for use with various constellations or mapping algorithms.

4.3 Data Storage Applications

A third application relates to data storage applications, for example, using the demapper in conjunction with various memory devices such as dynamic random access memories (DRAM), flash memories (including embedded flash memory), and storage systems where information is stored as variable with two or more quantization levels (such as multi-level flash memories).

In some implementations, the demapper may reside in a variety of places on a memory chip, including but not limited to, directly next to a memory cell, at the end of a memory column or row, or other locations along the read path of the memory device. In such applications, the demapper may be used for soft demapping/soft decoding of data stored in memory cells, for example, to improve the bit error rate of the memory. For memories, the demapper may also help improve the read speed over other types of memories that implements soft decoding methods based on current sense amplifier.

4.4 Mapping of the Analog Domain to Hard Decisions

A fourth application relates to mapping of the analog domain to hard decisions, such as converters that may be used for converting soft inputs into hard outputs. For example, a demapper may implement a flash A/D that maps each input range to a respective one of a discrete set of decision regions, where each decision region corresponds to a quantized level (e.g., representing a hard symbol or a hard bit). Such a demapper can be configured, for example, using a combination of configurable sigmoid generators whose transfer function takes near-rectangular shape. In some examples, the transfer function of a converter may take the form of a linear ladder. In some examples, the output of a converter may be fed into a digital encoder, which may convert the input to a binary value.

5 Other Examples

Various alternative embodiments of the systems and methods are possible.

Figure 14:
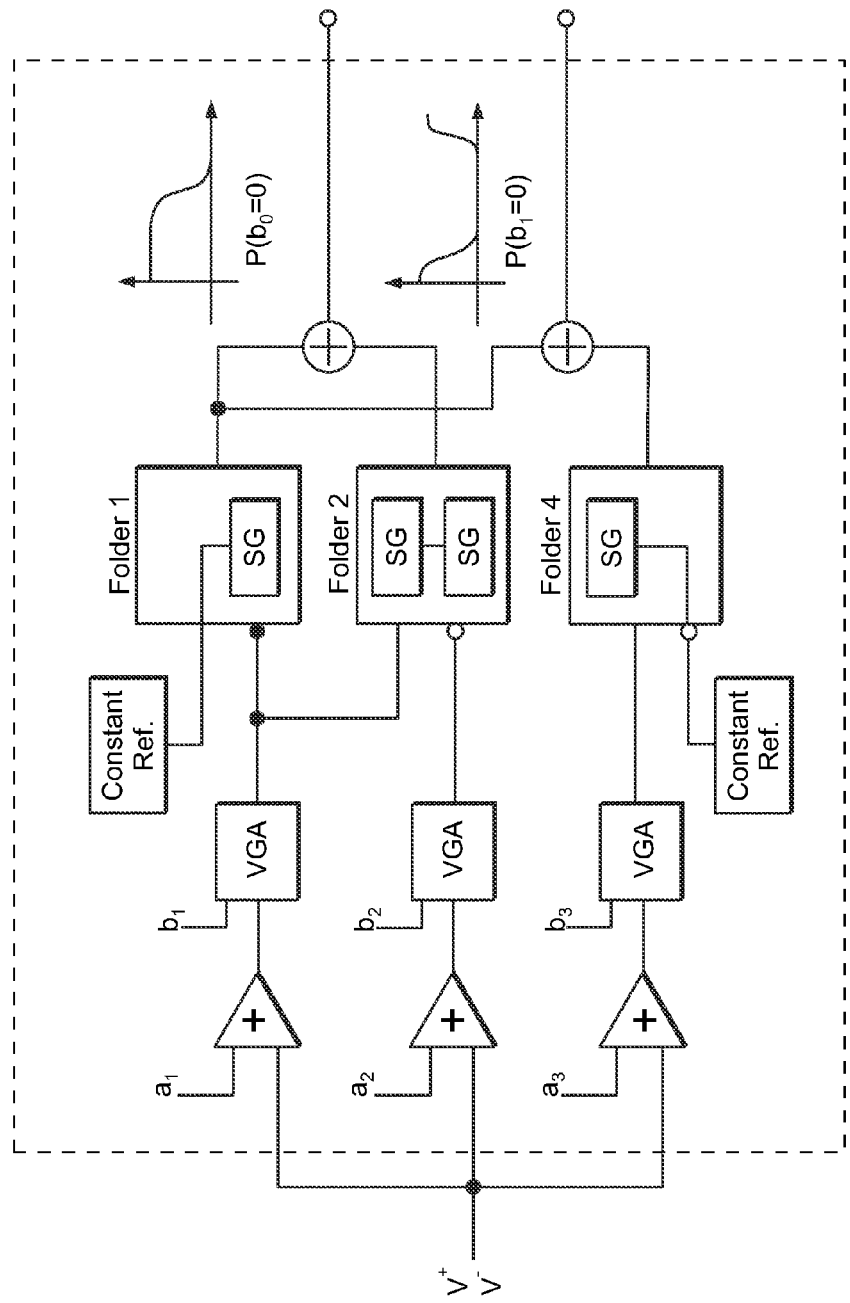
FIG. 14 illustrates one embodiment of a one-stage demapper.
Figure 25:
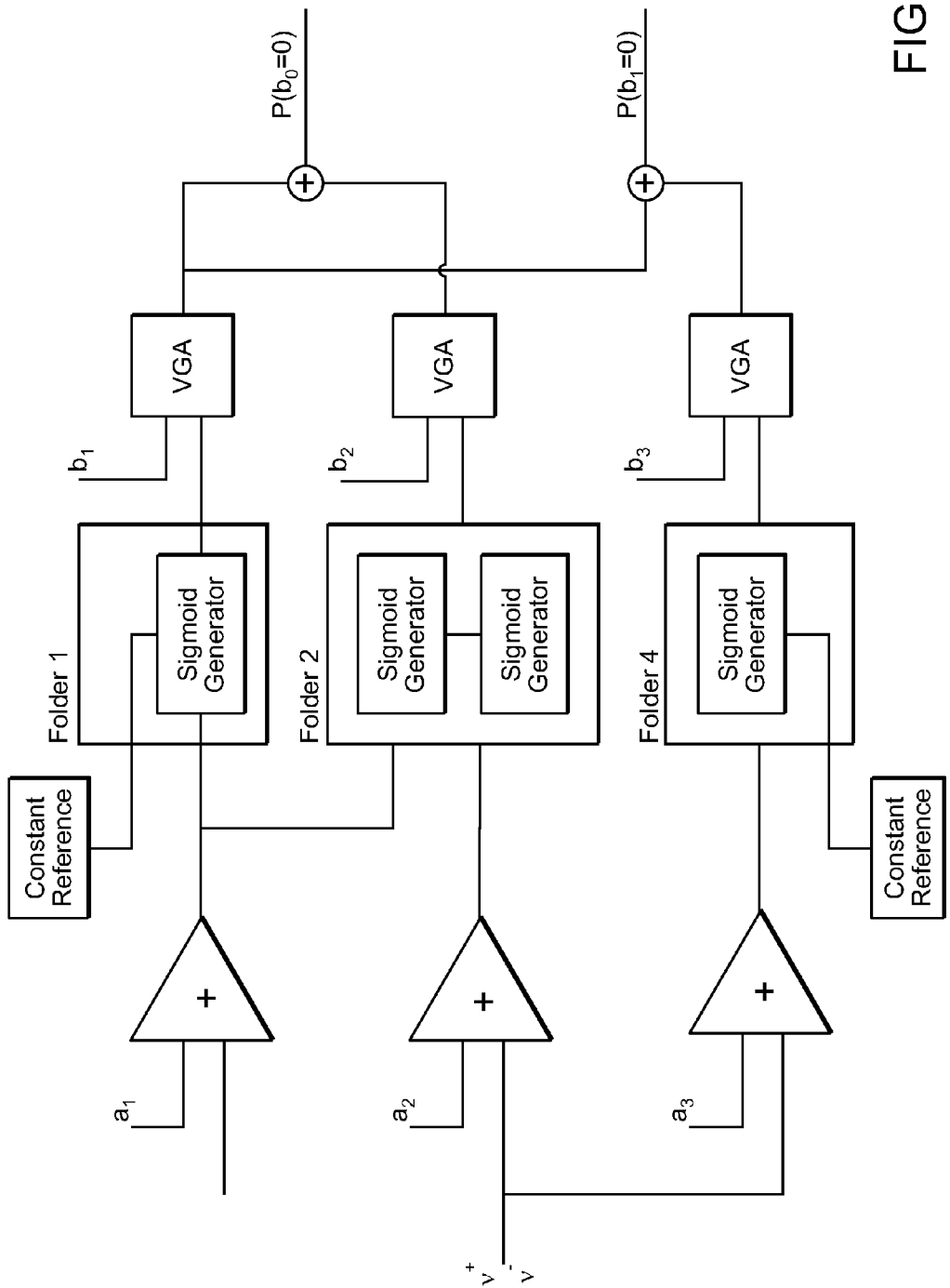
FIG. 25 illustrates a second embodiment of a one-stage demapper.

For example, as previously described, the demapper 210 of FIG. 2 implements two-stage analog processing that computes the symbol likelihoods and bit probabilities in succession. This approach allows design of reconfigurable hardware that is applicable to a variety of constellations or mapping algorithms, for example, by reusing a substantial amount of circuit components (e.g., folders that generate various bump-shaped or S-shaped transfer functions). In some other examples, an alternative demapper can be constructed to perform direct computation of bit probabilities in one stage. For instance, when a particular constellation is chosen, its structure can be exploited to determine alternative configurations of the folder circuits 820A-820D of FIG. 8 such that each folder employs an appropriate set of sigmoid generators for forming output signals that directly correspond to bit probabilities (without the need of producing symbol likelihoods). Such a one-stage approach may help the circuit to gain computational efficiencies for a targeted application, although at the expense of less flexibility in hardware configuration. One example of a single-stage demapper is shown in the block diagram of FIG. 14. A further example of a single stage demapper is shown in the block diagram of FIG. 25. Other alternatives are also possible.

In some embodiments, the demapper may be configured for demodulating transmitted signals into symbol likelihoods (without necessarily producing soft bits). The symbol likelihoods may then be provided to a subsequent circuit(s) for further processing.

In some applications, it may be useful to adopt differential signals in circuit design over conventional single-ended signals. Advantages of differential signals may include, for example, a larger dynamic range for circuit operation and higher noise immunity. In some examples, bit probabilities may also be generated in differential form such as:

$$DP(b_0)=P(b_0=1)-P(b_0=0) \qquad (4a)$$

$$DP(b_1)=P(b_1=1)-P(b_1=0) \qquad (4b)$$

$$DP(b_2)=P(b_2=1)-P(b_2=0) \qquad (4c)$$

$$DP(b_3)=P(b_3=1)-P(b_3=0) \qquad (4d)$$

where $DP(b_i)$ represents the differential probability of the $i^{th}$ bit.

Note that, in the circuit structure of FIG. 8, the characteristics of symbol likelihood output of each folder 820A-820D can be independently controlled by adjusting the corresponding parameters of the input transformation circuit 810. For example, parameter $a_1$ determines the offset of the symbol likelihood curve $P(S_0)$ and parameter $b_1$ determines the slope of the curve. In some applications, the spacing between the representative input values for different symbol likelihood curves may not necessarily be uniform. The slope (or the sharpness) of each curve may also differ. This can be useful for certain applications, for example, where different symbols may be transmitted with distinct noise characteristics. For example, end symbols $S_3$ may be transmitted using higher voltage signals (sometimes even at near-saturation level), which in some systems may inherently carry a stronger noise component. The configurability of the individual symbol likelihood curve enables a demapper to be customized to the particular channel or system that is used for data transmission. In addition, for memory or data storage applications, a demapper operable for retrieving memory may be specifically tuned based on the noise/error characteristics of a memory cell, an array of memory cells, or the respective symbols.

In some applications, a noise estimator may be implemented in conjunction with the demapper circuit of FIG. 8 for controlling the mapping characteristics of the demapper based on noise estimates. For example, the noise estimator may analyze the characteristics (such as the signal to noise ratio) of the input signal v to determine the desired shape (e.g., sharpness and spacing) of the symbol likelihood curves and therefore compute the corresponding a and b parameters to be provided to the demapper circuit. In addition, the noise estimator may implement a feedback mechanism by which the shape of the symbol likelihood curves can be tuned based on the performance (e.g., bit error rate) of a subsequent decoder circuit.

6 Log-Likelihood Ratio (LLR) Demapper

In the above description, a signal transmitted over the communication channel is processed in the demapper circuit in analog form using currents and/or voltages representing linear probabilities. In some other applications, the received signal may be processed alternatively to produce probability representations in the log domain, for example, log-odds or log likelihood ratio (LLR). The log likelihood ratio (LLR) of a variable x may be defined either as $$LLR_x = \log\left(\frac{P(x=0)}{P(x=1)}\right)$$

or alternatively as $$LLR_x = \log\left(\frac{P(x=1)}{P(x=0)}\right).$$

For the purposes of discussion, the first definition of $LLR_x$ will be used.

In one embodiment, soft demapper circuitry is configured to transform continuous-valued input signals to the LLR representation of symbol or bit probabilities.

Figure 15:
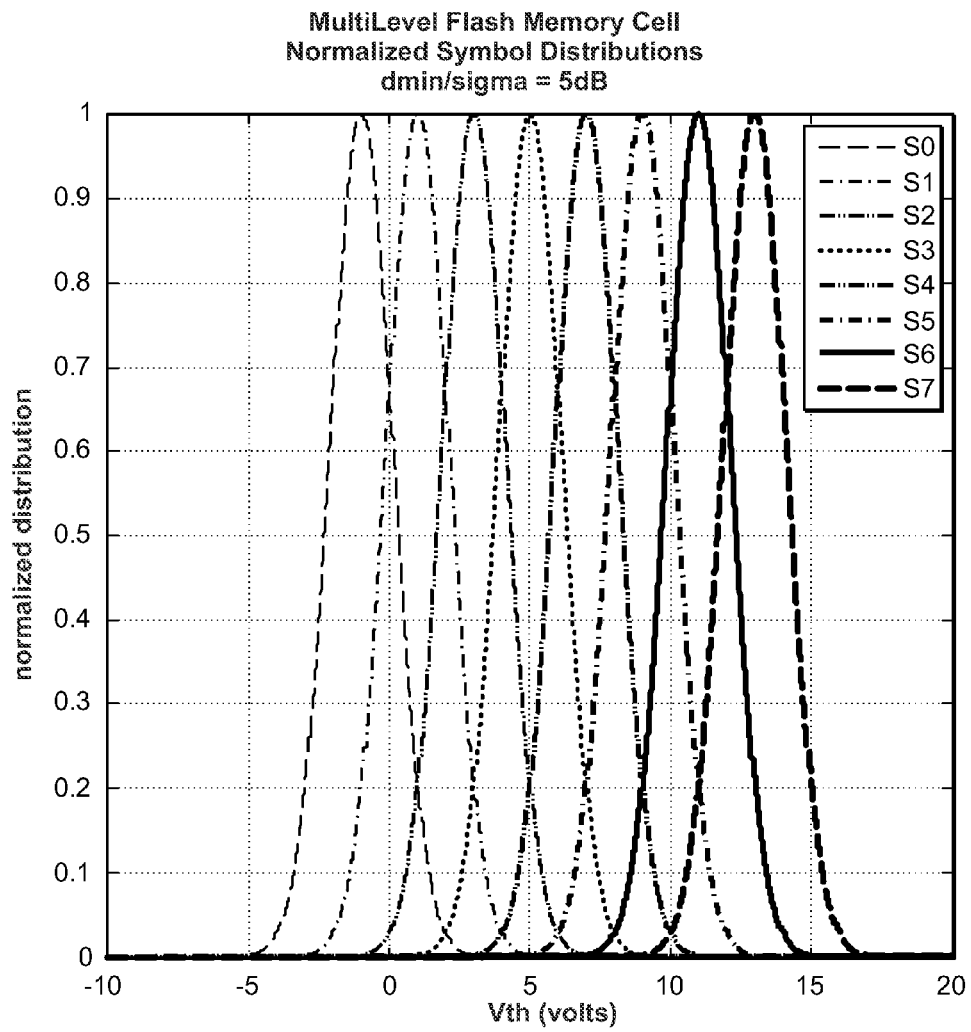
FIG. 15 is a plot of the voltage distributions of eight voltage signals from a PAM-8 communication channel.
Figure 16:
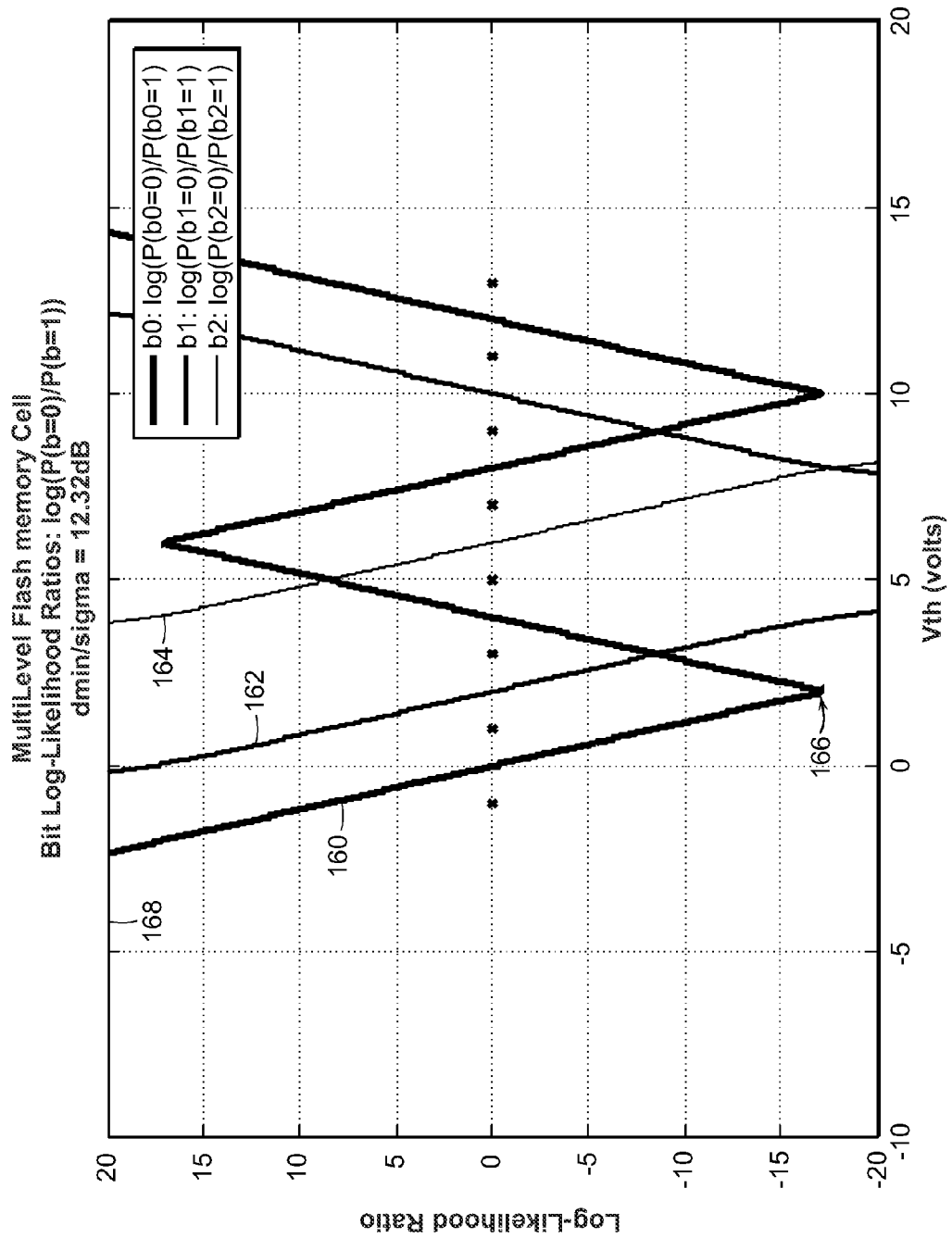
FIG. 16 is a plot of the log-likelihood ratio (LLR) curves corresponding to the voltage signals of FIG. 15.

Referring to FIG. 15, a set of eight Gaussian distributions of voltage signals from a PAM-8 communication channel are shown. FIG. 16 shows the corresponding calculated LLR curves for bit 0 (curve 160), bit 1 (curve 162), and bit 2 (curve 164). Generating an exact reproduction of these LLR curves using analog circuitry may be difficult and expensive from a circuit power and area perspective, for at least two reasons.

Firstly, it is difficult to implement discontinuities such as the sharp transitions between positive slope and negative slope (e.g., at a point 166 on curve 160). Secondly, the tails of the calculated LLR curves extend to infinity (e.g., in a region 168) beyond the boundary values of the set of signal levels being converted to a probabilistic representation.

Rather than generating exact representations of the LLR signals of FIG. 16 (e.g., by piecewise superposition of linear sections), approximations of the center portion of the LLR signals are in general sufficient for communicating the relevant probabilistic information to a decoder or demodulator for efficient and accurate computation. By approximating the LLR curves of FIG. 16 with curves having smooth transitions and by imposing limits on the upper and lower values of the curves, approximate curves can be obtained that contain sufficient information to achieve the desired performance in the subsequent decoding or demodulating step.

Figure 17A:
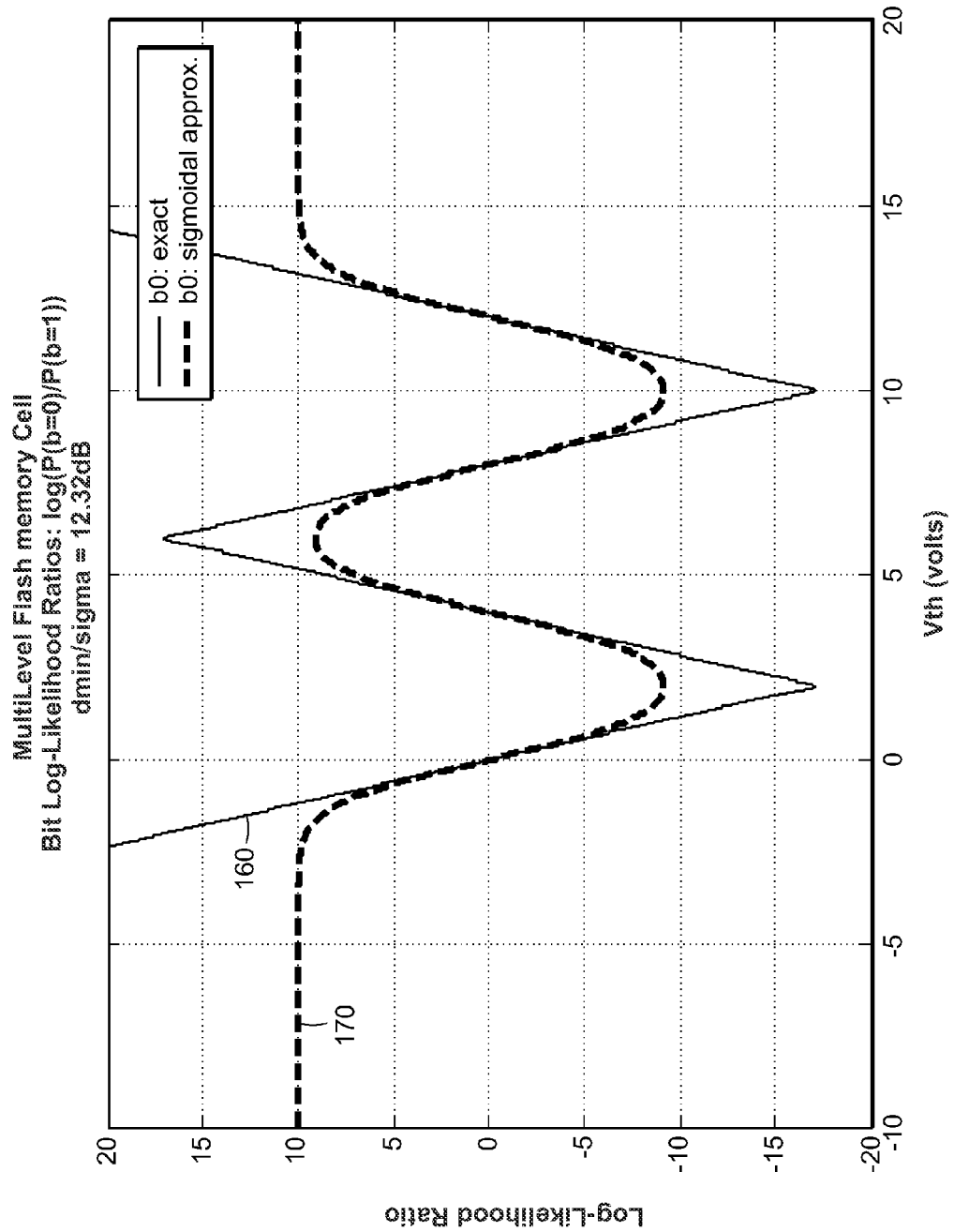
FIGS. 17A-17C are plots of the exact LLR curves of FIG. 16 and the corresponding approximate LLR curves.
Figure 17B:
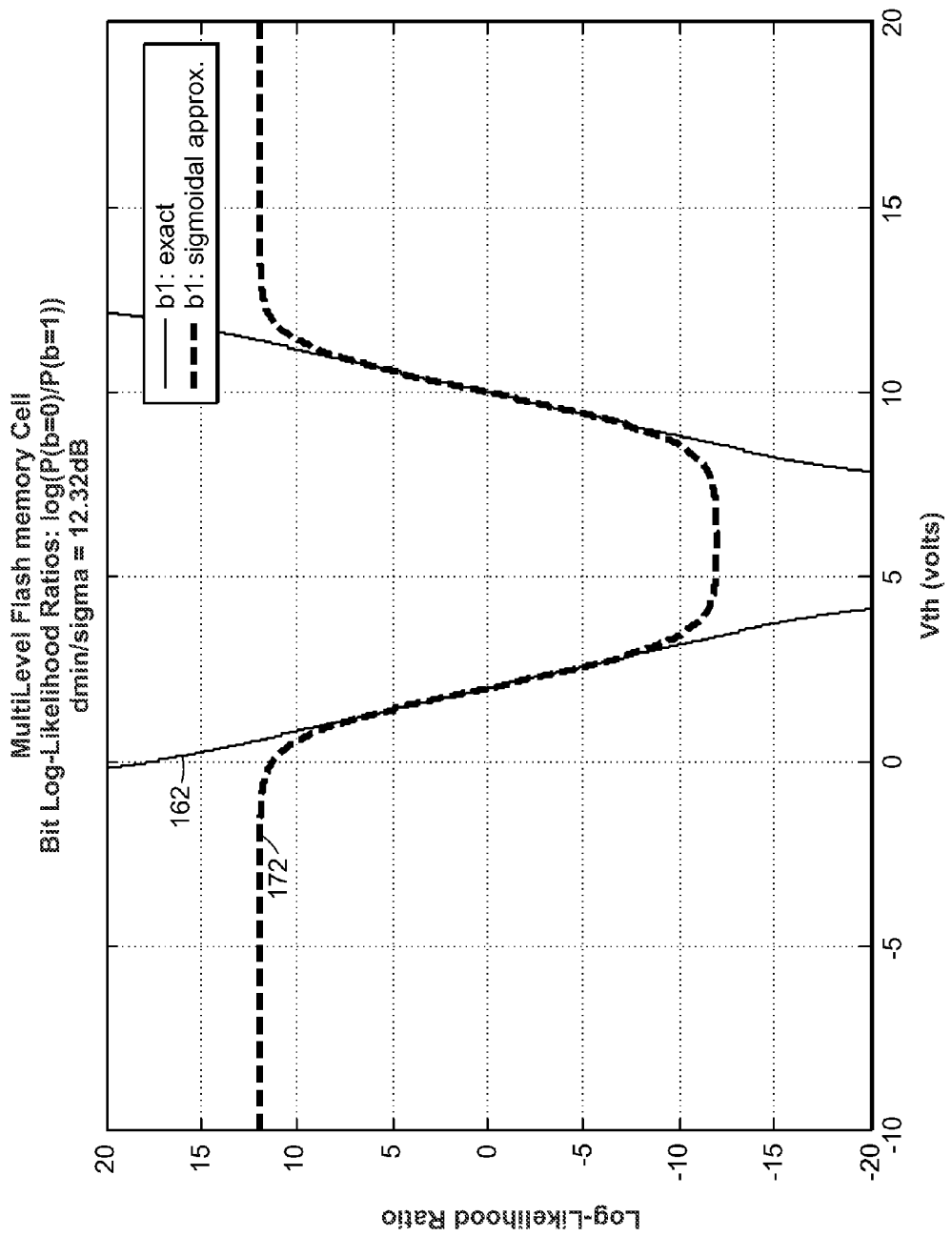
Figure 17C:
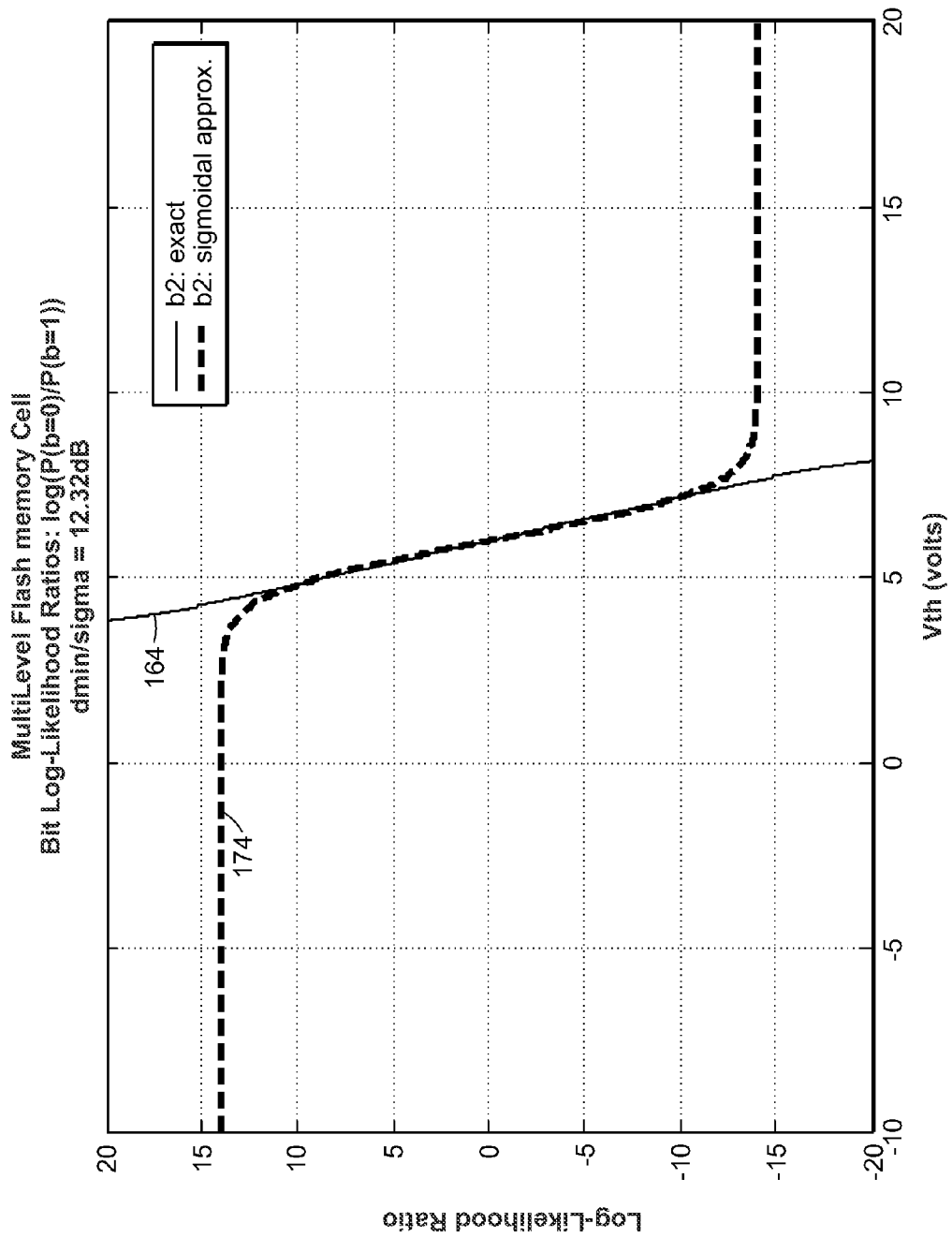
Figure 18:
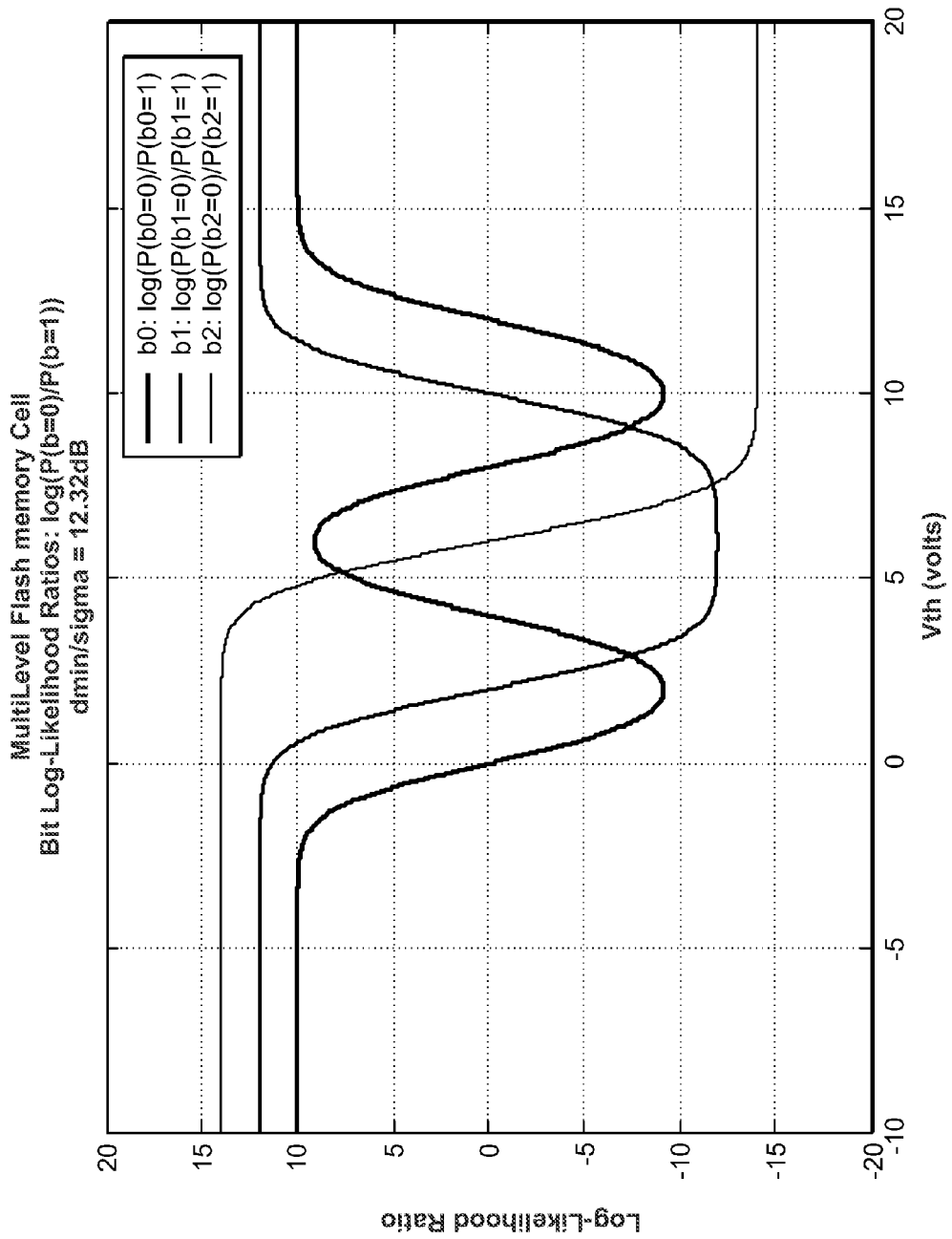
FIG. 18 is a plot of the approximate LLR curves of FIGS. 17A-17C.

Referring to FIGS. 17A-17C, approximate LLR curves 170, 172, and 174 correspond to exact LLR curves 160, 162, and 164, respectively. The transitions between positive slope and negative slope are smooth for the approximate curves and the curves are bounded so as not to extend to infinity. Referring to FIG. 18, the three approximate LLR curves 170, 172, and 174 are shown. The limits for each curve are staggered such that the magnitude of the upper and lower bounds for curve 172 (b=1) are marginally greater than the magnitude of the upper and lower bounds for curve 170 (b=0). Similarly, the magnitude of the upper and lower bounds for curve 174 (b=2) are marginally greater than the magnitude of the upper and lower bound for curve 172 (b=1). In general, for an arbitrary number of curves, the limits are staggered such that the limits for each successive bit are progressively larger than those for the previous bit.

Figure 19:
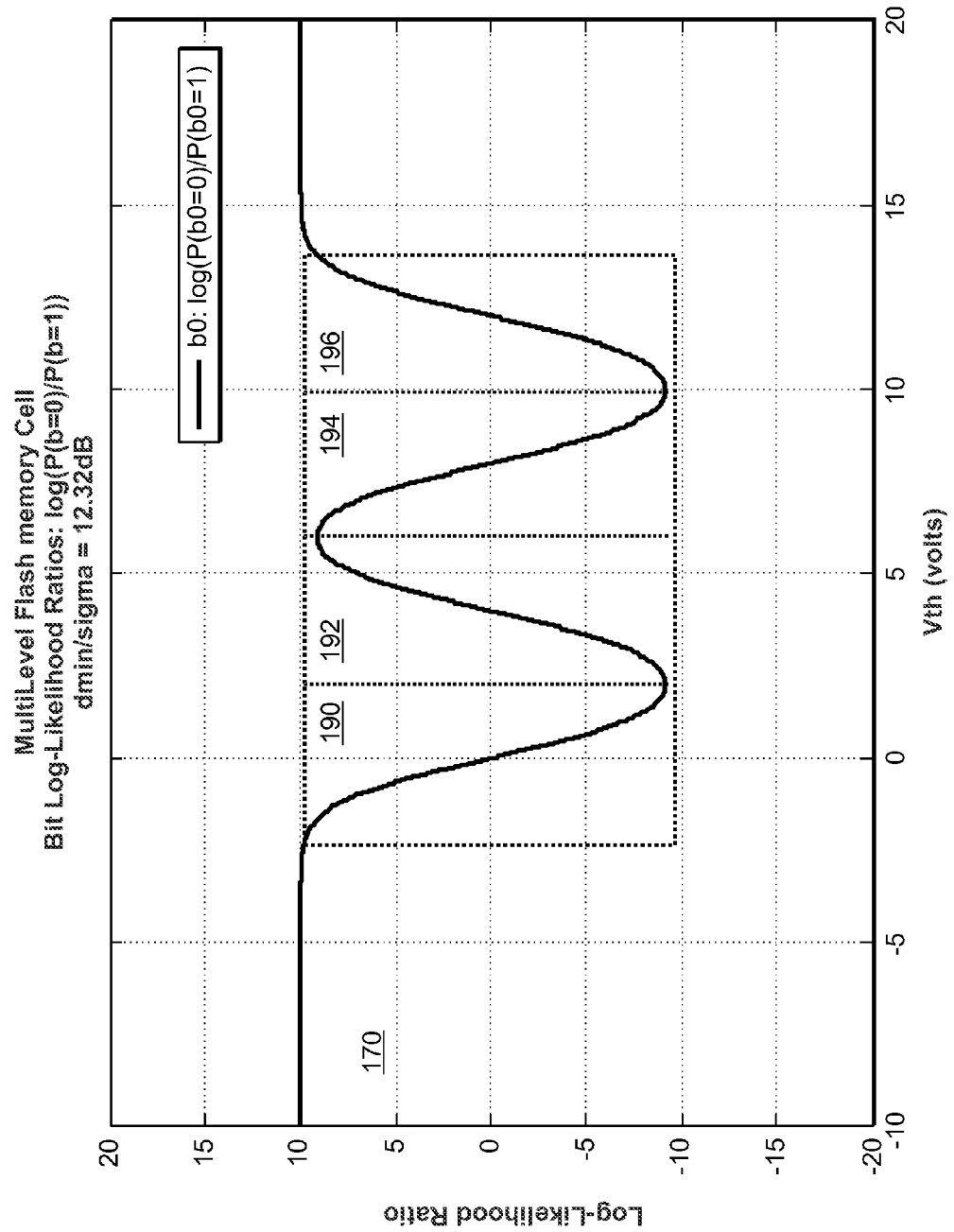
FIG. 19 is a plot of the approximate LLR curve corresponding to bit 0.

To implement approximate LLR curves 170, 172, and 174 in analog circuitry, it is useful to recognize that each approximate curve can be constructed of sigmoid shapes and mirror images of sigmoid shapes. For instance, referring to FIG. 19, curve 170 (b=0) can be broken down into four sigmoidally shaped sections 190, 192, 194, and 196.

Figure 20:
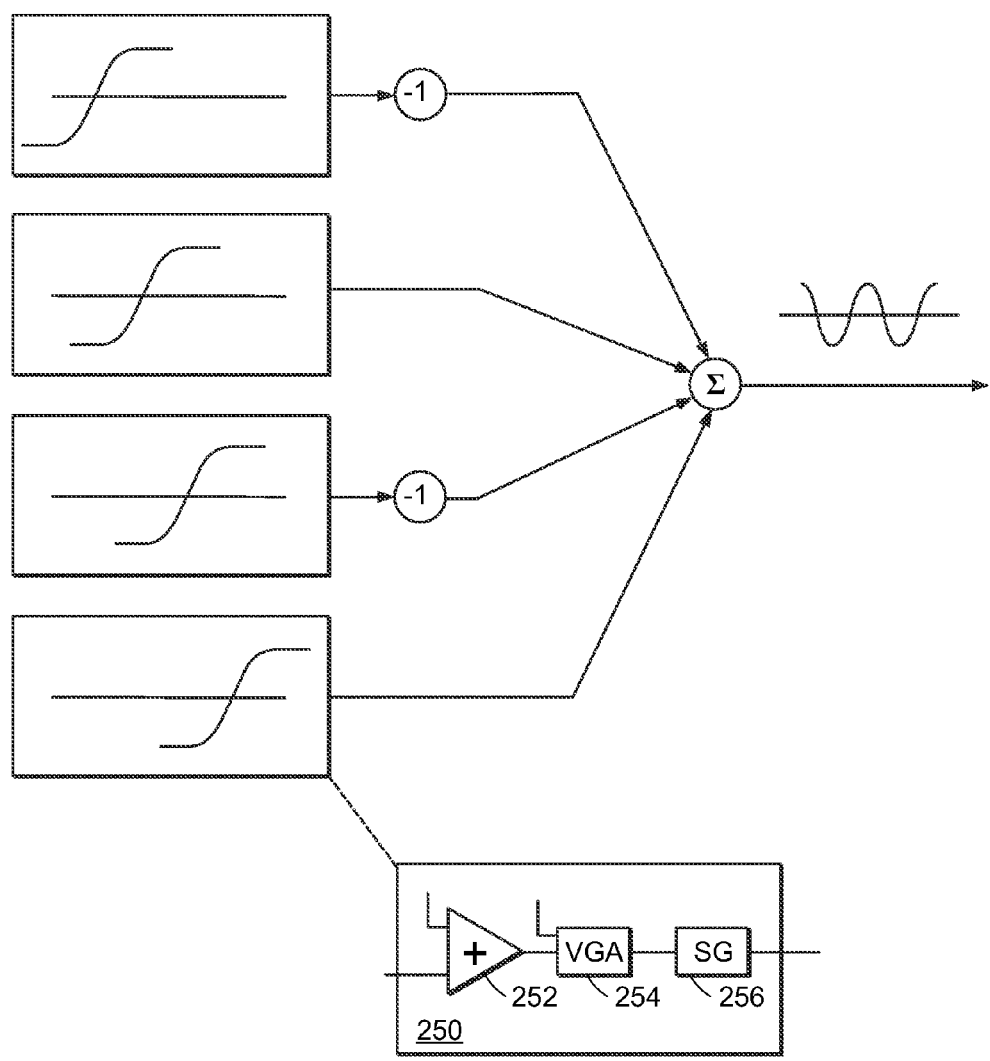
FIG. 20 is a block diagram of a circuit implementation that generates the approximate LLR curve of FIG. 19.
Figure 21A:
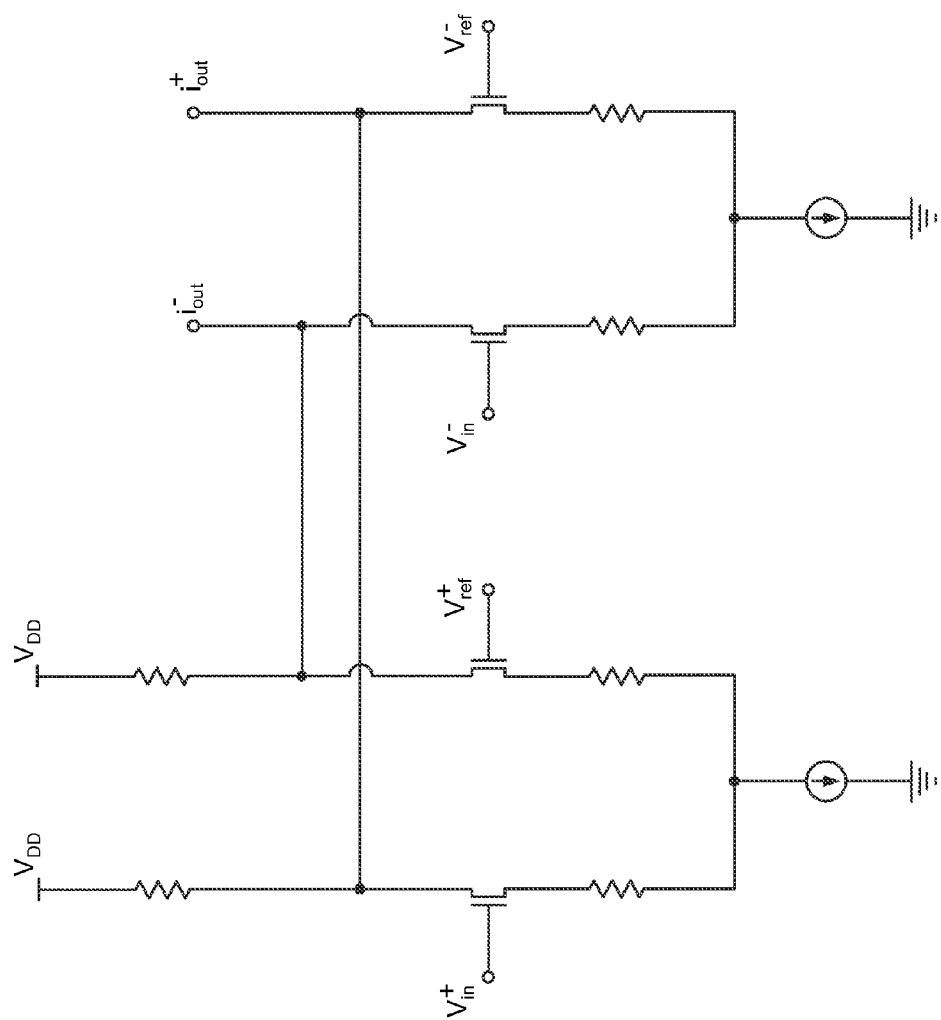
FIGS. 21A and 21B are circuit diagrams of an exemplary sigmoidal shifter circuit and an exemplary variable gain circuit, respectively, for use in the circuit implementation of FIG. 20.
Figure 21B:
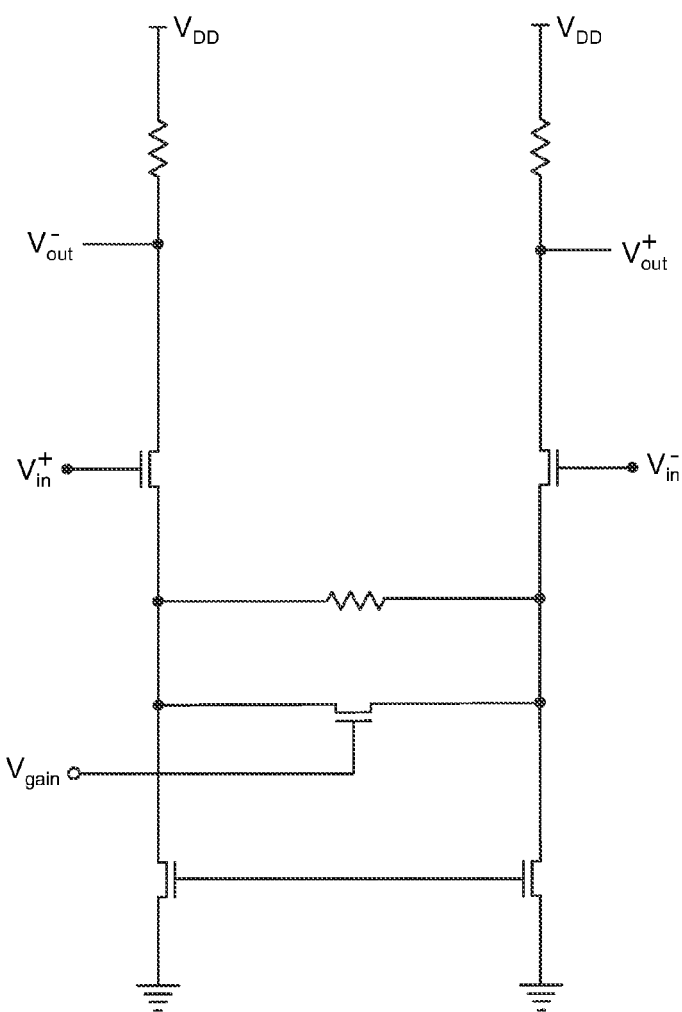

Referring to FIG. 20, each of these sigmoid sections can be implemented in differential pair circuitry 250 including a sigmoid generator 256. Differential pair circuitry 250 also includes gain elements such as a summer 252 to appropriately position each sigmoid section on the x-axis and a variable gain amplifier 254 to adjust the offset and slope of the sigmoid section. For instance, the varying LLR curve slopes with different additive white Gaussian noise (AWGN) characteristics can be addressed through an appropriate setting of the variable gain amplifier 254. In the case of curve 170, four instantiations of circuitry 250 are used to generate two sigmoidal shapes (corresponding to sections 192 and 196) and two mirror images (corresponding to sections 190 and 194). Curve 172 (b=1) can be implemented with two instantiations of circuitry 250; curve 174 (b=2) can be implemented with one instantiation of circuitry 250. FIGS. 21A and 21B provide examples of a summer circuit and a variable gain circuit, respectively, for use in circuitry 250. Other circuit arrangements are also possible.

Figure 26:
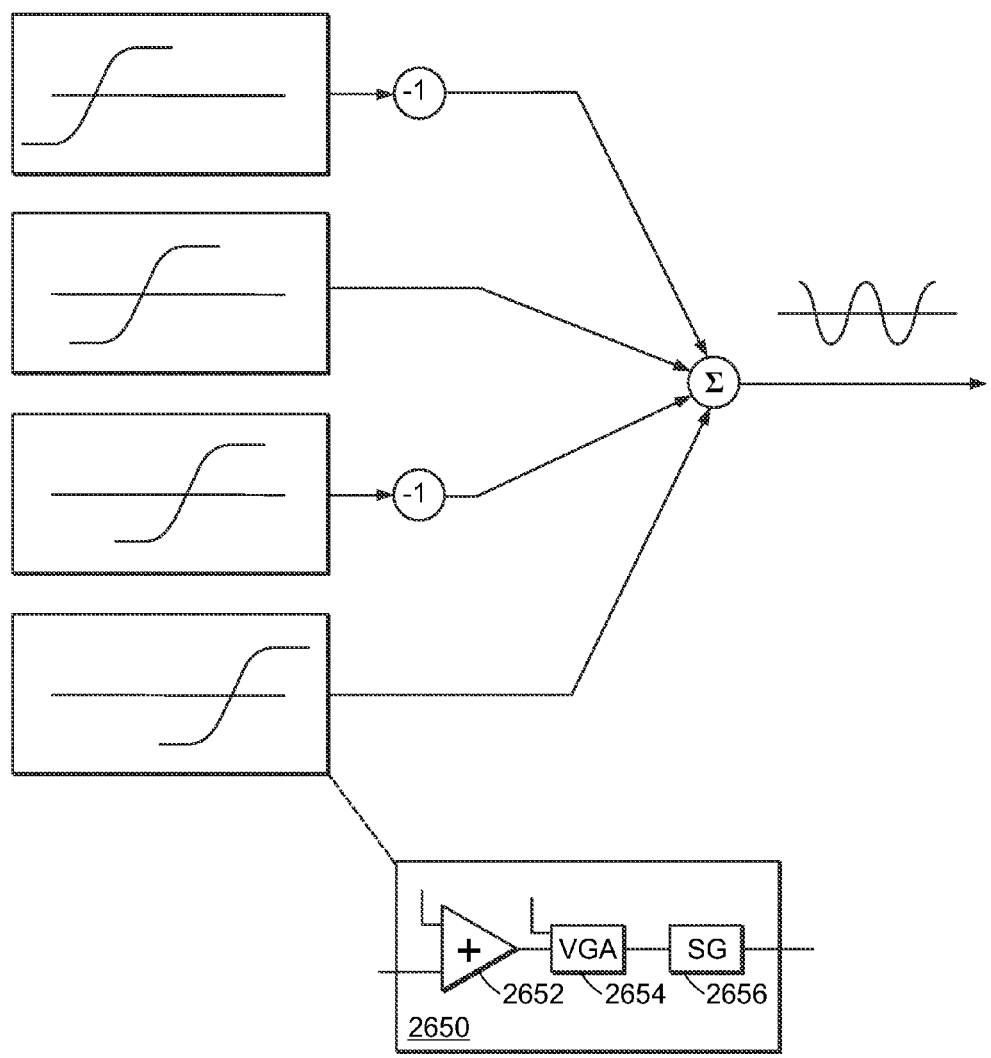
FIG. 26 is a block diagram of a second embodiment of a circuit that generates the approximate LLR curve of FIG. 19

Referring to FIG. 26, in another embodiment, differential pair circuitry 2650 is used to implement each sigmoid section. Differential pair circuitry 2650 includes a summer 2652, a sigmoid generator 2656, and a variable gain amplifier 2654. The summer and variable gain circuits of FIGS. 21A and 21B, respectively, may be used in differential pair circuitry 2650.

In the above sigmoid generators, the current outputs carry current signals with only a single polarity. As depicted in FIGS. 21A and 21B, the output pins are current sinks into which current flows; there are no current sources at which current flows out of the output pins. To add the current waveforms generated by these sigmoid generators to create a single LLR hump, such as curve 172 in FIG. 17B, two curve segments (a sigmoid and a mirror image of a sigmoid) can be added without adjustment.

In order to generate additional bends in the curve, such as the multiple sigmoid segments of curve 170, additional curve segments must be added, which alters the DC positioning of the final output curve. However, curves with multiple bends are used to implement higher order PAM encoded signals or to implement more than two bits in a single dimension. Two approaches may be taken to accommodate for this DC shift. In one approach, a DC adjustment current may be added. In a second approach, current mirrors may be used to create current waveforms of opposite polarity, thus avoiding the DC shifts in the output signal, but introducing additional complexity in the circuit.

Only the common mode levels of the outputted current signals will have this DC component. The differential signal obtained from the approach described above has an acceptable common mode around zero. For the common mode of the individual single ended sides of the signal, the DC component preferably does not build up to a level outside of a range acceptable for interfacing with other circuitry, such as a subsequent decoder.

In other embodiments, the symbol likelihood generator 800 of FIG. 8 may be configured to be operable in the log regime, for example, by coupling each folder with additional circuit components that convert the bump-shaped or S-shaped symbol likelihood transfer functions to the desired forms in the log domain. For instance, a variable gain amplifier may be added at each bit probability output to amplify the outputs in order to approximate the slope of the corresponding LLR curve. Additionally, appropriately staggered limiters may be added to limit the values of the outputs at the symbol boundaries. However, these circuit elements may be costly. In an alternative embodiment, the symbol likelihood generator 800 of FIG. 8 may be configured to be operable in the log regime, for example, by simply setting the parameter a's and b's to best approximate the required transfer functions.

Note that the communication system described herein is understood in a broad context, without being limited to telecommunication systems or communication networks. Also, the methods and systems can be generally applied to areas where statistical inference techniques are suited for extracting information from data that has been corrupted by various sources of noise and/or distortion.

It is to be understood that the foregoing description is intended to illustrate and not to limit the scope of the invention, which is defined by the scope of the appended claims. Other embodiments are within the scope of the following claims.

What is claimed is:

1. A circuit comprising:
   a signal processing circuit for accepting an input and for generating a set of outputs, the input being in an input range including a set of representative values, and each output representing a measure of an association of the input with one or more of the representative values, the signal processing circuit including:
   a plurality of output sections, each output section being responsive to the input of the signal processing circuit, each output section including:
   one or more configurable sigmoid generators, each sigmoid generator being configurable based on a channel characteristic of a communication channel over which the input is communicated and responsive to an input of the output section to generate an output that represents a sigmoid function of the input of the output section; and
   a circuitry for combining the outputs of the one or more sigmoid generators to form one of the set of outputs of the signal processing circuit; and
   an input transformation circuit coupled to the plurality of output sections, the input transformation circuit being configurable to transform the input of the signal processing circuit for controlling a mapping characteristic from the input to the set of outputs.

2. The circuit of claim 1, wherein the output of the sigmoid generator represents a second sigmoid function of the input to the signal processing circuit.

3. The circuit of claim 2, wherein the mapping characteristic from the input to the set of outputs is associated with a characteristic of the second sigmoid function.

4. The circuit of claim 3, wherein the characteristic of the second sigmoid function includes a location of a transition point of the sigmoid function.

5. The circuit of claim 3, wherein the characteristic of the second sigmoid function includes a rate of change at a transition point of the sigmoid function.

6. The circuit of claim 1, wherein at least one output section includes two sigmoid generators.

7. The circuit of claim 1, wherein each output section further comprises an output transformation circuit configurable to transform the output of the corresponding one or more sigmoid generators for controlling a second mapping characteristic from the input to the set of outputs.

8. The circuit of claim 1, wherein each sigmoid generator includes a differential pair circuit.

9. The circuit of claim 8, wherein the differential pair circuit includes a pair of transistors each configured to receive the input of the sigmoid generator in a respective one of two polarities.

10. The circuit of claim 8, wherein the differential pair circuit includes a pair of MOSFET transistors configured to operate in an above-threshold operation regime.

11. The circuit of claim 8, wherein the differential pair circuit includes a pair of bipolar junction transistors.

12. The circuit of claim 1, wherein the input to the signal processing circuit includes an analog signal representing a digital string transmitted in the form of a symbol over a communication channel.

13. The circuit of claim 12, where each representative value of the input range is associated with a respective one of a discrete set of possible symbols.

14. The circuit of claim 13, wherein each output of the signal processing circuit represents a respective probability of the transmitted symbol corresponds to one of the possible symbols.

15. The circuit of claim 13, wherein each output of the signal processing circuit represents a respective probability of a corresponding digit of the transmitted digital string having one of a discrete set of possible values.

16. The circuit of claim 15, wherein the transmitted digital string is a binary string.

17. The circuit of claim 13, where each output of the signal processing circuit includes a representation of the transmitted bit in the log domain.

18. The circuit of claim 12, wherein the analog signal includes a noise component at least partially determined by the communication channel.

19. The circuit of claim 18, wherein the analog signal includes a Gaussian noise component.

20. The circuit of claim 1, wherein the input to the signal processing circuit is implemented in the form of a differential signal.

21. The circuit of claim 1, where each input to the output sections is implemented in the form of a differential signal.

22. A signal processing circuit for accepting an input and for generating a set of outputs, the input being in an input range including a set of representative values, and each output representing a measure of an association of the input with one or more of the representative values, the signal processing circuit comprising:
   a plurality of sections, each section generating a corresponding one of the set of outputs, each section including:
      one or more input transformation circuits configurable to transform the input of the signal processing circuit for controlling a mapping characteristic from the input to the corresponding output;
      one or more configurable sigmoid generators, each sigmoid generator coupled to a corresponding input transformation circuit and configured to receive the transformed input from the corresponding input transformation circuit and to generate a sigmoid output that represents a sigmoid function of the input, wherein each sigmoid generator is configurable based on a channel characteristic of a communication channel over which the input is communicated; and
      circuitry for combining the sigmoid outputs from the sigmoid generators to form one of the set of outputs of the signal processing circuit.

23. The signal processing circuit of claim 22, wherein each output in the set of outputs includes a representation of the input in the log domain.

24. The signal processing circuit of claim 23, wherein each output in the set of outputs represents a log-likelihood ratio of the input.

25. The signal processing circuit of claim 22, wherein each section further includes one or more output transformation circuits, each output transformation circuit coupled to a corresponding sigmoid generator and configurable to transform the corresponding sigmoid output for controlling a second mapping characteristic from the input to the corresponding output.

26. A method for accepting an input and for generating a set of outputs, the input being in an input range including a set of representative values, and each output representing a measure of association of the input with one or more of the representative values, the method comprising:
   transforming the input using input transformation circuitry to control a mapping characteristic from the input to the set of outputs;
   in each of a plurality of output sections, performing the steps of:
      generating at least one sigmoid output representing a sigmoid function of the transformed input, each sigmoid output generated by a corresponding configurable sigmoid generator, the sigmoid generator being configurable based on a channel characteristic of a communication channel over which the input is communicated; and
      combining the sigmoid outputs using combining circuitry to form one of the set of outputs.

27. The method of claim 26, wherein the output of the sigmoid generator represents a second sigmoid function of the input.

28. The method of claim 27, wherein the mapping characteristic from the input to the set of outputs is associated with a characteristic of the second sigmoid function.

29. The method of claim 28, wherein the characteristic of the second sigmoid function includes at least one of a location of a transition point of the sigmoid function and a rate of change at a transition point of the sigmoid function.

30. The method of claim 26, further comprising, in each of the plurality of output sections, transforming each sigmoid output using corresponding output transformation circuitry to control a second mapping characteristic from the input to the set of outputs.

* * * * *